United States Patent
Hirano et al.

(10) Patent No.: US 12,419,142 B2
(45) Date of Patent: Sep. 16, 2025

(54) NITRIDE SEMICONDUCTOR ULTRAVIOLET LIGHT EMITTING ELEMENT

(71) Applicant: NIKKISO CO., LTD., Tokyo (JP)

(72) Inventors: Akira Hirano, Aichi (JP); Yosuke Nagasawa, Nara (JP)

(73) Assignee: NIKKISO CO., LTD., Tokyo (JP)

( * ) Notice: Subject to any disclaimer, the term of this patent is extended or adjusted under 35 U.S.C. 154(b) by 419 days.

(21) Appl. No.: 18/022,147

(22) PCT Filed: Sep. 17, 2020

(86) PCT No.: PCT/JP2020/035236
§ 371 (c)(1),
(2) Date: Feb. 18, 2023

(87) PCT Pub. No.: WO2022/059125
PCT Pub. Date: Mar. 24, 2022

(65) Prior Publication Data
US 2023/0307578 A1    Sep. 28, 2023

(51) Int. Cl.
*H10H 20/825* (2025.01)
*H10H 20/812* (2025.01)
(Continued)

(52) U.S. Cl.
CPC ........ *H10H 20/825* (2025.01); *H10H 20/812* (2025.01); *H10H 20/8162* (2025.01); *H10H 20/818* (2025.01)

(58) Field of Classification Search
CPC ............. H10H 20/825; H10H 20/8162; H10H 20/818; H10H 20/812
See application file for complete search history.

(56) References Cited

U.S. PATENT DOCUMENTS

2011/0303891 A1* 12/2011 Chua ................ B82Y 20/00
                                                                257/13
2015/0243856 A1    8/2015 Yamada et al.
(Continued)

FOREIGN PATENT DOCUMENTS

| JP | 2009123969 A | 6/2009 |
| WO | 2014178288 A1 | 11/2014 |

(Continued)

OTHER PUBLICATIONS

Kojima et al., "Carrier localization structure combined with current micropaths in AlGaN quantum wells grown on an AlN template with macrosteps," Applied Physics letter 114, Jan. 7, 2019, 6 pages.

(Continued)

*Primary Examiner* — Mark W Tornow
(74) *Attorney, Agent, or Firm* — Andrew L. Dunlap; Haynes Beffel & Wolfeld LLP

(57) ABSTRACT

A nitride semiconductor ultraviolet light-emitting element is provided. The element includes a light-emitting element with n-type, active, and p-type layers stacked vertically and made of AlGaN-based wurtzite structured semiconductors. The active layer has a quantum-well structure and each layer is epitaxially grown having a surface on which multi-step terraces parallel to the (0001) plane are formed. The n-type layer has a stratiform regions with locally lower AlN mole fraction which is inclined with respect to an upper surface of the n-type layer. The p-type layer has a lowermost electron blocking layer and an uppermost contact layer. Each semiconductor layer in the active layer and the electron blocking layer have inclined regions with respect to the (0001) plane connecting adjacent terraces of the multi-step terraces, and terrace regions other than inclined regions. An AlN mole fraction of the terrace regions in the electron blocking layer is between 69% and 89%, inclusive.

20 Claims, 17 Drawing Sheets

(51) Int. Cl.
*H10H 20/816* (2025.01)
*H10H 20/818* (2025.01)

(56) References Cited

U.S. PATENT DOCUMENTS

| | | | |
|---|---|---|---|
| 2017/0200865 A1* | 7/2017 | Brummer | H10H 20/821 |
| 2017/0263817 A1* | 9/2017 | Hirano | H01L 21/288 |
| 2021/0043804 A1* | 2/2021 | Hirano | H10H 20/0137 |

FOREIGN PATENT DOCUMENTS

| | | | |
|---|---|---|---|
| WO | 2016157518 A1 | 10/2016 | |
| WO | 2019159265 A1 | 8/2019 | |

OTHER PUBLICATIONS

Nagasawa et al., "Comparison of AlxGa1?xN multiple quantum wells designed for 265 and 285nm deep-ultraviolet LEDs grown on AlN templates having macrosteps," Applied Physics Express 12, Jun. 4, 2019, 6 pages.

* cited by examiner (A) Al₁Ga₅N₆

(B) Al₁Ga₂N₃

(C) Al₁Ga₁N₂

(D) Al₂Ga₁N₃

(E) Al₅Ga₁N₆

● : Ga
○ : Al

NITRIDE SEMICONDUCTOR ULTRAVIOLET LIGHT EMITTING ELEMENT

TECHNICAL FIELD

The present invention relates to a nitride semiconductor ultraviolet light-emitting element with a peak emission wavelength within a range of 250 nm to 310 nm comprising a light-emitting element structure part with an n-type layer, an active layer, and a p-type layer stacked vertically which are made of AlGaN-based semiconductors with wurtzite structure.

BACKGROUND ART

In general, there are a lot of nitride semiconductor light-emitting elements with a light-emitting element structure comprising a plurality of nitride semiconductor layers formed by epitaxial growth on a substrate such as sapphire. A nitride semiconductor layer is represented by the general formula: $Al_{1-x-y}Ga_xIn_yN$ ($0 \leq x \leq 1$, $0 \leq y \leq 1$, $0 \leq x+y \leq 1$).

The light-emitting element structure of a light-emitting diode has a double hetero structure in which an active layer made of a nitride semiconductor layer having a single-quantum-well structure (SQW) or a multi-quantum-well structure (MQW) is sandwiched between two cladding layers of an n-type nitride semiconductor layer and a p-type nitride semiconductor layer. When the active layer is an AlGaN-based semiconductor, by adjusting an AlN mole fraction (also referred to as an Al composition ratio), band gap energy can be adjusted within a range where band gap energies that can be taken by GaN and AlN (about 3.4 eV and about 6.2 eV) are lower and upper limits, so that an ultraviolet light-emitting element having an emission wavelength of about 200 nm to about 365 nm is obtained. Specifically by passing a forward current from the p-type nitride semiconductor layer toward the n-type nitride semiconductor layer, light emission corresponding to the band gap energy due to recombination of carriers (electrons and holes) occurs in the active layer. In order to supply the forward current from the outside, a p-electrode is provided on the p-type nitride semiconductor layer, and an n-electrode is provided on the n-type nitride semiconductor layer.

When the active layer is an AlGaN-based semiconductor, the n-type nitride semiconductor layer and the p-type nitride semiconductor layer sandwiching the active layer are composed of the AlGaN-based semiconductor having a higher AlN mole fraction than the active layer. However, since the p-type nitride semiconductor layer of a high AlN mole fraction is difficult to form a good ohmic contact with the p-electrode, it is generally performed to form a p-type contact layer made of a p-type AlGaN semiconductor with a low AlN mole fraction (specifically p-GaN), which can have a good ohmic contact with the p-electrode, to the uppermost layer of the p-type nitride semiconductor layer. Since the AlN mole fraction of the p-type contact layer is smaller than that of the AlGaN-based semiconductor constituting the active layer, ultraviolet light emitted toward the p-type nitride semiconductor layer side from the active layer is absorbed in the p-type contact layer and cannot be effectively extracted to the outside of the element. Therefore, a typical ultraviolet light-emitting diode having an active layer made of an AlGaN-based semiconductor employs an element structure as schematically shown in FIG. 15. The ultraviolet light emitted toward the n-type nitride semiconductor layer side from the active layer is effectively extracted to the outside of the element (e.g., see Patent Documents 1 and 2, Non-Patent Documents 1 and 2, etc. listed below).

As shown in FIG. 15, the typical UV light-emitting diode is constructed by depositing an n-type AlGaN-based semiconductor layer 103, an active layer 104, a p-type AlGaN-based semiconductor layer 105, and a p-type contact layer 106 on a template 102 formed by depositing an AlGaN-based semiconductor layer 101 (e.g., AlN layer) on a substrate 100 such as a sapphire substrate, and etching away respective portions of the active layer 104, the p-type AlGaN-based semiconductor layer 105, and the p-type contact layer 106 until the n-type AlGaN-based semiconductor layer 103 is exposed, and forming an n-electrode 107 on the exposed surface of the n-type AlGaN-based semiconductor layer 103 and an p-electrode 108 on the surface of the p-type contact layer 106.

In addition, in order to improve luminous efficiency (internal quantum efficiency) by carrier recombination in the active layer, the active layer is formed in a multi-quantum-well structure, and an electron blocking layer is provided on the active layer.

In the nitride semiconductor ultraviolet light-emitting element comprising a light-emitting element structure part with an n-type layer, an active layer, and a p-type layer stacked vertically which are made of AlGaN-based semiconductors with wurtzite structure, each semiconductor layer in the n-type layer, the active layer, and the p-type layer is an epitaxially grown layer having a surface on which multi-step terraces parallel to the (0001) plane are formed. In Non-Patent Documents 1 and 2 described below, a structure in which the multi-step terraces are exposed on the surface of the semiconductor layer is expressed as macrosteps.

In each semiconductor layer in the n-type cladding layer made of an n-type AlGaN-based semiconductor layer and the respective well layers of a multi-quantum-well structure made of AlGaN-based semiconductor layers, compositional modulation due to segregation of Ga (segregation associated with mass-transfer of Ga) occurs. As a result, in the macrosteps structure, stratiform regions with a locally lower AlN mole fraction extending obliquely to the surface of the n-type cladding layer are formed in the n-type cladding layer, and inclined regions with a locally lower AlN mole fraction inclined with respect to the (0001) plane and connecting between the adjacent terraces parallel to the (0001) plane are formed in each of the well layers (see Non-Patent Documents 1, 2 described below, particularly FIG. 1 of Non-Patent Document 1 and FIG. 5 of Non-Patent Document 2). Incidentally, the inclined region consists of many steps (steps of one unit cell) and macrosteps (steps of multiple unit cells), and the (0001) surface shown stepwise on the inclined region is distinguished from the terrace surface of the multi-step terraces.

Furthermore, because the band gap energy of the AlGaN-based semiconductor layer with the locally lower AlN mole fraction is also locally reduced, the carriers in the n-type cladding layer are easily localized in the stratiform regions, and the carriers in the respective well layers are easily localized in the inclined regions. It is reported in Patent Documents 1 and 2 described below that the stratiform regions function as low resistance current paths and can efficiently supply the carriers in the n-type cladding layer to the inclined regions in the respective well layers since the inclined regions in the respective well layers are located on the extensions of the stratiform regions in the n-type cladding layer, and that the internal quantum efficiency of the nitride semiconductor ultraviolet light-emitting element can be improved since the inclined regions in the respective well layers become localized centers of radiative recombination.

PRIOR ART DOCUMENTS

Patent Document

Patent Document 1: WO2014/178288
Patent Document 2: WO2016/157518
Patent Document 3: WO2019/159265

Non-Patent Document

NON-PATENT DOCUMENT 1: Y. Nagasawa, et al., "Comparison of AlxGa1-XN multiple quantum wells designed for 265 and 285 nm deep-ultraviolet LEDs grown on AlN templates having macrosteps", Applied Physics Express 12, 064009 (2019)
NON-PATENT DOCUMENT 2: K. Kojima, et al., "Carrier localization structure combined with current micropaths in AlGaN quantum wells grown on an AlN template with macrosteps", Applied Physics letter 114, 011102 (2019)

SUMMARY OF THE INVENTION

Problems to be Solved by the Invention

In order to improve the luminous efficiency by recombination of carriers (electrons and holes) in the well layer, injection of carriers (holes) from the p-type layer side into the well layer must be efficient as well as injection of carriers (electrons) from the n-type layer side into the well layer. In general, in order to increase the efficiency of injection of carriers (electrons) from the n-type layer side into the well layer, an electron blocking layer having an AlN mole fraction of usually 80% or more, which is higher than the AlN mole fractions of the n-type cladding layer and the quantum barrier layer, is provided on the p-type layer side of the well layer closest to the p-type layer in the active layer.

In the electron blocking layer, similarly to the well layer, multi-step terraces parallel to the (0001) plane are formed, so that inclined regions, which are inclined with respect to the (0001) plane and connecting between the adjacent terraces, are formed. However, in the conventional nitride semiconductor ultraviolet light-emitting element, since the AlN mole fraction of the electron blocking layer is extremely high, compositional modulation due to segregation of Ga occurring in the n-type cladding layer and the well layer is less likely to occur in the electron blocking layer, and the AlN mole fraction in the electron blocking layer is less likely to differ between the inclined regions and the terrace regions.

With growing of the side surfaces of the terrace edges toward lateral direction in step flow growth, a terrace on each upper surface of the well layer and the electron blocking layer moves laterally relative to a terrace on each lower surface of the well layer and the electron blocking layer, so that a film thickness of the well layer and the electron blocking layer in the inclined regions is getting thicker than that of the terrace regions other than the inclined regions.

FIG. 16 shows the high-angle annular dark-field (HAADF)-STEM image of the cross section of the conventional nitride semiconductor ultraviolet light-emitting element having the n-type cladding layer (n-clad), the active layer with three layers of quantum wells (QW) and the electron blocking layer (EB). In HAADF-STEM image, contrasts proportional to atomic weights are obtained, and heavy elements are displayed brightly. Therefore, regions with a low AlN mole fraction are displayed relatively bright. HAADF-STEM image is more suitable for observing differences in AlN mole fraction than the normal STEM image (bright-field image).

It can be seen from FIG. 16 that the stratiform regions having locally lower AlN mole fraction are present dispersed in the vertical direction in the n-type cladding layer, and each of the stratiform regions is extending in a direction inclined with respect to the upper surface of the n-type cladding layer on a viewing surface of the HAADF-STEM image. It can also be confirmed from FIG. 16 that the respective inclined regions of the well layer and the electron blocking layer are present at locations intersecting with the extending direction of the stratiform regions in the active layer and the electron blocking layer, and that the inclined regions are thicker than the terrace regions. In FIG. 16, although it can be confirmed that the compositional modulation due to segregation of Ga in the n-type cladding layer and the well layers occurs and the AlN mole fraction decreases at the stratiform regions in the n-type cladding layer and at the inclined regions in the well layers, it cannot be confirmed that the compositional modulation due to segregation of Ga occurs in the electron blocking layer and the AlN mole fraction decreases at the inclined regions in the electron blocking layer.

In the conventional nitride semiconductor ultraviolet light-emitting element, it can be an obstacle to efficient injection of carriers (holes) from the p-type layer side into the well layer that the compositional modulation due to segregation of Ga and local decrease in AlN mole fraction such as in the well layer does not occur in the inclined regions of the electron blocking layer, and that the film thickness of the inclined regions is larger than that of the terrace regions. This point will be schematically described in FIG. 17.

When a forward bias is applied between the p-electrode and the n-electrode, as schematically shown in FIG. 17, holes (h+) are injected from the p-type contact layer (p-GaN) into the electron blocking layer (EB). However, as mentioned above, the AlN mole fraction in the inclined regions is not locally reduced within the electron blocking layer, localization of carriers (holes) is not induced, and conversely since the thickness of the inclined regions is large and their electrical resistance is high, passage of holes is blocked, and the holes injected into the electron blocking layer reach the terrace regions in the well layer from the terrace regions in the electron blocking layer. On the other hand, electrons (e−) reach the inclined regions in the well layer (QW) from the n-type cladding layer side through the stratiform regions. In order for electrons and holes to radiatively recombine at the localized center in the inclined regions of the well layer (indicated by ☆ (asterisk) in the figure), the holes reaching the terrace region in the well layer need to diffuse and reach the inclined regions. However, the diffusion length of holes is shorter than that of electrons, and the amount of holes that diffuse and reach the inclined regions is limited, and some of the holes that reach the terrace regions of the well layer are captured by non-radiative recombination centers (indicated by • (solid circles) in the figure) such as Al vacancies, which are point defects, during diffusion, and cause non-radiative recombination, resulting in a problem of reduced internal quantum efficiency.

Furthermore, in the nitride semiconductor ultraviolet light-emitting element having a peak emission wavelength of about 285 nm or more, the AlN mole fraction of the AlGaN-based semiconductor constituting the well layer is low compared with the case of the peak emission wavelength less than about 285 nm, so that the number of Al vacancies that become point defects is relatively small, and the holes that reach the terrace region in the well layer are radiatively recombined in the terrace regions having a higher AlN mole fraction than in the inclined regions, and a problem arises that emission occurs at shorter wavelength than in the inclined regions. Specifically double peak light emission occurs in which two light emission peaks having different wavelengths are not combined into one peak and appear separately in the light emission spectrum, and it becomes a factor of yield reduction.

The present invention has been made in view of the above-mentioned problems, and an object of the present invention is to suppress the decrease in internal quantum efficiency or the occurrence of double peak light emission in a nitride semiconductor ultraviolet light-emitting element with a peak emission wavelength within a range of 250 nm to 310 nm comprising a light-emitting element structure part with an n-type layer, an active layer, and a p-type layer stacked vertically which are made of AlGaN-based semiconductors with wurtzite structure.

Means for Solving the Problem

The present invention, in order to achieve the above object, provides a nitride semiconductor ultraviolet light-emitting element with a peak emission wavelength within a range of 250 nm to 310 nm comprising a light-emitting element structure part in which an n-type layer, an active layer, and a p-type layer made of an AlGaN-based semiconductor of wurtzite structure are stacked vertically. As the first feature of the nitride semiconductor ultraviolet light-emitting element according to the present invention, the n-type layer is composed of an n-type AlGaN-based semiconductor,
the active layer disposed between the n-type layer and the p-type layer has a quantum-well structure having one or more well layers composed of an AlGaN-based semiconductor,
the p-type layer is composed of a p-type AlGaN-based semiconductor,
each semiconductor layer in the n-type layer, the active layer and the p-type layer is an epitaxially grown layer having a surface on which multi-step terraces parallel to a (0001) plane are formed,
the n-type layer has a plurality of stratiform regions uniformly distributed in the n-type layer with locally lower AlN mole fraction,
each extending direction of the stratiform regions on a first plane perpendicular to an upper surface of the n-type layer has a portion inclined with respect to an intersection line between the upper surface of the n-type layer and the first plane,
the p-type layer has an electron blocking layer as a lowermost layer of the p-type layer formed on an upper surface side of an uppermost layer of the one or more well layers, and a contact layer as an uppermost layer of the p-type layer composed of a p-type GaN-based semiconductor,
each semiconductor layer in the active layer and the electron blocking layer have inclined regions inclined with respect to the (0001) plane connecting between adjacent terraces of the multi-step terraces, and terrace regions other than the inclined regions, respectively an AlN mole fraction of the terrace regions in the electron blocking layer is 69% or more and 89% or less, and the inclined regions of the electron blocking layer include a first Ga-rich region in which an AlN mole fraction is locally lower than that of the terrace regions of the electron blocking layer, and
the inclined regions of the well layer include a second Ga-rich region in which an AlN mole fraction is locally lower than that of the terrace regions in the well layer.

The AlGaN-based semiconductor is represented by the general formula $Al_{1-x}Ga_xN$ ($0 \le x \le 1$), but the semiconductor may contain a trace amount of an impurity such as a Group 3 element such as B or In or a Group 5 element such as P, as far as the band gap energy is within the lower limit and the upper limit of the band gap energy that can be obtained by GaN and AlN, respectively. The GaN-based semiconductor is basically a nitride semiconductor composed of Ga and N, and may contain a trace amount of an impurity such as a Group 3 element such as Al, B, or In or a Group 5 element such as P. The AlN-based semiconductor is basically a nitride semiconductor composed of Al and N, and may contain a trace amount of an impurity such as a Group 3 element such as Ga, B, or In or a Group 5 element such as P. Therefore, in the present application, the GaN-based semiconductor and the AlN-based semiconductor are a part of the AlGaN-based semiconductor, respectively.

Furthermore, the n-type or p-type AlGaN-based semiconductor is an AlGaN-based semiconductor in which Si or Mg or the like is doped as a donor impurity or an acceptor impurity. In the present application, the AlGaN-based semiconductor, not specified as p-type or n-type, means undoped AlGaN-based semiconductor, but even if undoped, a trace amount of donor or acceptor impurities to the extent of being inevitably mixed may be included. The first plane is not an exposed surface or a boundary surface between the n-type layer and other semiconductor layer which is specifically formed in the manufacturing process of the n-type layer but is a virtual plane extending in parallel to the vertical direction in the n-type layer. Furthermore, in this specification, an AlGaN-based semiconductor layer, a GaN-based semiconductor layer, and an AlN-based semiconductor layer are semiconductor layers composed of the AlGaN-based semiconductor, the GaN-based semiconductor, and the AlN-based semiconductor, respectively.

Furthermore, the AlN mole fraction in the terrace regions in each semiconductor layer of the electron blocking layer, the active layer such as the well layer, and the p-type layer means the average AlN mole fraction obtained by averaging the variations in the AlN mole fraction within the terrace regions due to the mass-transfer of Ga occurring on each terrace surface.

According to the nitride semiconductor ultraviolet light-emitting element having the above-described first feature, since the inclined regions of the electron blocking layer include the first Ga-rich region in which the AlN mole fraction is locally lower than the AlN mole fraction in the terrace regions and localization of carriers (holes) can occur within the first Ga-rich region unlike the conventional nitride semiconductor ultraviolet light-emitting element, holes injected into the electron blocking layer can also be injected directly into the inclined regions. As a result, the amount of holes that are directly injected into the inclined regions of the electron blocking layer and reach the inclined regions of the well layer, which are the localized centers of radiative recombination, without diffusing within the terrace regions is greatly increased, and it is possible to suppress the decrease in internal quantum efficiency and the occurrence of double emission peaks, which have been problems in the conventional nitride semiconductor ultraviolet light-emitting element.

Furthermore, the present invention provides the nitride semiconductor ultraviolet light-emitting element having the second feature in addition to the above-described first feature, wherein the first Ga-rich region has a first metastable p-type region in which an AlGaN composition ratio is an integer ratio of $Al_5Ga_1N_6$ or $Al_3Ga_1N_4$ or $Al_2Ga_1N_3$.

An ultraviolet light-emitting element composed of the AlGaN-based semiconductors is produced on a substrate such as a sapphire substrate by a well-known epitaxial growth method such as, for example, a metalorganic vapor phase epitaxy (MOVPE) method. However, when producing the ultraviolet light-emitting element, the characteristics of the ultraviolet light-emitting element (properties such as emission wavelength, wall plug efficiency forward bias, etc.) fluctuate under the influence by drift of the crystal growth apparatus, so that the producing at a stable yield is not always easy.

The drift of the crystal growth apparatus occurs due to a change in the effective temperature of the crystal growth site or the like owing to deposits on trays, chamber walls, or the like. Therefore, in order to suppress the drift, conventionally treatments such as fine adjustments of the set temperature and the composition of source gases by experienced persons with examining the growth history fixing the growth schedule for a certain period, and performing maintenance such as cleaning in the same manner for a certain period are performed, but it is difficult to eliminate the drift completely.

According to the nitride semiconductor ultraviolet light-emitting element having the above-described second feature, it is expected that the characteristic variation caused by the drift of the crystal growth apparatus or the like is suppressed and a nitride semiconductor ultraviolet light-emitting element having the desired emission characteristic is stably produced by utilizing the first metastable p-type region, which is composed of a metastable AlGaN as described later, formed in the first Ga-rich region in the electron blocking layer.

Furthermore, according to the nitride semiconductor ultraviolet light-emitting element having the above-described second feature, since the AlN mole fraction in the terrace regions of the electron blocking layer is in the range of 69% to 89%, whichever integer ratio of $Al_5Ga_1N_6$(AlN mole fraction: 5/6=83.3%) or $Al_3Ga_1N_4$(AlN mole fraction: 3/4=75%) or $Al_2Ga_1N_3$ (AlN mole fraction: 2/3=66.7%) the AlGaN composition ratio of the first metastable p-type region in the first Ga-rich region is, the setting range of AlN molar fraction in the terrace regions can be adjusted in the electron blocking layer according to the AlGaN composition ratio of the first metastable p-type region ensuring the AlN molar fraction difference between the terrace region and the first metastable p-type region to be about 2% or more. Therefore, carriers (holes) in the p-type layer are more stably localized in the inclined region including the first Ga-rich region having a lower bandgap energy than the terrace region in the electron blocking layer, and the current can preferentially and stably flow through the first Ga-rich region in the electron blocking layer, so that the characteristic variation of the nitride semiconductor ultraviolet light-emitting element can be suppressed.

In this specification, when AlN mole fractions of AlGaN composition ratios which are integer ratios of $Al_5Ga_1N_6$, $Al_2Ga_1N_3$, $Al_7Ga_5N_{12}$, $Al_5Ga_7N_{12}$, $Al_1Ga_2N_3$, and $Al_1Ga_5N_6$ are expressed as a percentage, respectively they are approximately indicated as 83.3%, 66.7%, 58.3%, 41.7%, 33.3%, and 16.7%.

Furthermore, the present invention provides the nitride semiconductor ultraviolet light-emitting element having the third feature in addition to the above-described first feature, wherein the p-type layer has a p-type cladding layer composed of a p-type AlGaN-based semiconductor between the electron blocking layer and the contact layer, the p-type cladding layer has inclined regions inclined with respect to the (0001) plane connecting between adjacent terraces of the multi-step terraces, and terrace regions other than the inclined regions, respectively an AlN mole fraction of the terrace regions in the p-type cladding layer is 52% or more and less than the AlN mole fraction of the terrace regions in the electron blocking layer, and the inclined regions of the p-type cladding layer include a third Ga-rich region in which an AlN mole fraction is locally lower than that of the terrace regions in the p-type cladding layer.

According to the nitride semiconductor ultraviolet light-emitting element having the above-described third feature, since the inclined regions of the p-type cladding layer include the third Ga-rich region in which the AlN mole fraction is locally lower than the AlN mole fraction in the terrace regions and localization of carriers (holes) can occur within the third Ga-rich region, holes injected into the p-type cladding layer can also be injected directly into the inclined regions or can diffuse in the terrace regions and reach the inclined regions. Therefore, some of the holes that are injected from the p-type contact layer made of low-resistance p-GaN into the terrace region of the thin-film electron blocking layer and reach the terrace region of the well layer directly if the p-type cladding layer is not formed can be guided from the terrace regions of the p-type cladding layer into the inclined regions and reach the inclined regions of the well layer, and it is possible to further suppress the decrease in internal quantum efficiency and the occurrence of double emission peaks.

Furthermore, the present invention provides the nitride semiconductor ultraviolet light-emitting element having the fourth feature in addition to the above-described third feature, wherein the first Ga-rich region has a first metastable p-type region composed of a p-type metastable AlGaN in which an AlGaN composition ratio is an integer ratio of $Al_5Ga_1N_6$ or $Al_3Ga_1N_4$ or $Al_2Ga_1N_3$, and the third Ga-rich region has a second metastable p-type region composed of a p-type metastable AlGaN in which an AlGaN composition ratio is an integer ratio of $Al_2Ga_1N_3$ or $Al_7Ga_5N_{12}$ or $Al_1Ga_1N_2$ and the AlN mole fraction is less than the AlN mole fraction in the first metastable p-type region.

According to the nitride semiconductor ultraviolet light-emitting element having the above-described fourth feature, it is expected that a nitride semiconductor ultraviolet light-emitting element having the desired emission characteristic is stably produced by utilizing the first metastable p-type region composed of the metastable AlGaN as described later, which is formed in the first Ga-rich region in the electron blocking layer, and the second metastable p-type region composed of the metastable AlGaN as described later, which is formed in the third Ga-rich region in the p-type cladding layer to suppress the characteristic variation caused by the drift of the crystal growth apparatus or the like.

Furthermore, according to the nitride semiconductor ultraviolet light-emitting element having the above-described fourth feature, since the AlN mole fraction in the terrace regions of the electron blocking layer is in the range of 69% to 89%, whichever integer ratio of $Al_5Ga_1N_6$(AlN mole fraction: $5/6=83.3\%$) or $Al_3Ga_1N_4$(AlN mole fraction: $3/4=75\%$) or $Al_2Ga_1N_3$ (AlN mole fraction: $2/3=66.7\%$) the AlGaN composition ratio of the first metastable p-type region in the first Ga-rich region is, the setting range of AlN molar fraction in the terrace regions can be adjusted in the electron blocking according to the AlGaN composition ratio of the first metastable p-type region ensuring the AlN molar fraction difference between the terrace region and the first metastable p-type region layer to be about 2% or more. Furthermore, since the AlN mole fraction in the terrace regions of the p-type cladding layer is in the range of 52% or more and less than the AlN mole fraction of the terrace regions in the electron blocking layer, whichever integer ratio of $Al_2Ga_1N_3$(AlN mole fraction: $2/3=66.7\%$) or $Al_7Ga_5N_{12}$ (AlN mole fraction: $7/12=58.3\%$) or $Al_1Ga_1N_2$ (AlN mole fraction: $1/2=50\%$) the AlGaN composition ratio of the second metastable p-type region in the third Ga-rich region is, the setting range of AlN molar fraction in the terrace regions can be adjusted in the p-type cladding layer according to the AlGaN composition ratio of the second metastable p-type region ensuring the AlN molar fraction difference between the terrace region and the second metastable p-type region layer to be about 2% or more. Therefore, carriers (holes) in the p-type layer are more stably localized in the inclined region including the third Ga-rich region having a lower bandgap energy than the terrace region in the p-type cladding layer and more stably localized in the inclined region including the first Ga-rich region having a lower bandgap energy than the terrace region in the electron blocking layer, and the current can preferentially and stably flow through the third Ga-rich region and the first Ga-rich region in the p-type cladding layer and the electron blocking layer, so that the characteristic variation of the nitride semiconductor ultraviolet light emitting element can be suppressed.

Here, a "metastable AlGaN" in which an AlGaN composition ratio is represented by a predetermined integer ratio will be described.

Usually a ternary mixed crystal such as AlGaN is a crystalline state in which group 3 elements (Al and Ga) are randomly mixed and is approximately described by "random non-uniformity". However, because the covalent bond radius of Al and the covalent bond radius of Ga are different, the higher the symmetry of the atomic arrangement of Al and Ga in the crystal structure, the more stable the structure is in general.

The AlGaN-based semiconductors with wurtzite structure can have two types of arrangements, a random arrangement without symmetry and a stable symmetric arrangement. Here, a state in which the symmetric arrangement is dominant appears at a constant rate. In the "metastable AlGaN" described later, in which an AlGaN composition ratio (composition ratio of Al, Ga, and N) is represented by a predetermined integer ratio, a periodic symmetric arrangement structure of Al and Ga develops.

In the periodic symmetric arrangement structure, even if amount of Ga supplied to the crystal growth surface is slightly increased or decreased, the mixed crystal mole fraction becomes slightly stable in terms of energy because of the high symmetry and it is possible to prevent proliferation of places where amount of easily mass-transferring Ga is extremely increased. That is, by utilizing the properties of the first and second metastable p-type regions, which are metastable AlGaNs, formed in the first and second Ga-rich regions in the p-type layer, as an AlGaN-based semiconductor, even if the variation of the mixed crystal mole fraction due to the drift of the crystal growth apparatus or the like occurs, the variation of the mixed crystal mole fraction in the inclined regions in the electron blocking layer and the p-type cladding layer which provide the low resistance current paths to the active layer as described later is locally suppressed. Consequently stable carrier supply from the p-type layer into the active layer can be realized and variation in device characteristics can be suppressed, so that it is expected to stably produce a nitride semiconductor ultraviolet light-emitting element that achieves the desired characteristics.

Next, the AlGaN composition ratio in which Al and Ga can be in the periodic symmetric arrangement in the (0001) plane will be described.

FIG. 1 shows a schematic diagram of one unit cell (two monolayers) along the c-axis of AlGaN. In FIG. 1, open circles indicate sites where atoms of Group 3 elements (Al, Ga) are located, and solid circles indicate sites where atoms of Group 5 elements (N) are located.

The site planes (A3 plane, B3 plane) of the Group 3 elements and the site planes (A5 plane, B5 plane) of the Group 5 element shown by hexagons in FIG. 1 are both parallel to the (0001) plane. Six sites at each vertex of the hexagon and one site at the center of the hexagon are present at each site of the A3 and A5 planes (collectively, plane A). The same applies to the B3 plane and the B5 plane (collectively B plane), but in FIG. 1, it illustrates only three sites present in the hexagon of the B plane. Each site of the A plane is overlapped in the c-axis direction, each site of the B plane is overlapped in the c-axis direction. However, the atom (N) of one site on the B5 plane forms a quaternary bond with the atoms (Al, Ga) of the three sites on the A3 plane located above the B5 plane and the atom (Al, Ga) of one site on the B3 plane located below the B5 plane, and the atom (Al, Ga) of one site on the B3 plane forms a quaternary bond with the atom (N) of one site on the B5 plane located above the B3 plane and the atoms (N) of three sites on the A5 plane located below the B3 plane, so that each site on the A plane does not overlap each site on the B plane in the c-axis direction, as shown in FIG. 1.

FIG. 2 shows a positional relationship between each site of the A plane and the B plane, as a plan view as viewed from the c-axis direction. In both the A and B planes, each of the six vertices of the hexagon is shared by the other two hexagons adjacent to each other, and the site at the center is not shared with the other hexagons, so there are substantially three atomic sites within one hexagon. Thus, there are six sites of Group 3 element atoms (Al, Ga) and six sites of Group 5 element atoms (N) per unit cell. Therefore, the following five cases exist as AlGaN composition ratios expressed by the integer ratio excluding GaN and AlN.

1) $Al_1Ga_5N_6$
2) $Al_2Ga_4N_6$ ($=Al_1Ga_2N_3$)
3) $Al_3Ga_3N_6$ ($=Al_1Ga_1N_2$)
4) $Al_4Ga_2N_6$ ($=Al_2Ga_1N_3$)
5) $Al_5Ga_1N_6$

FIG. 3 schematically shows the A3 plane and the B3 plane of the group 3 element in the above five combinations. Ga is indicated by a solid circle, and Al is indicated by an open circle.

In the case of $Al_1Ga_5N_6$ shown in FIG. 3 (A), Ga is located at six vertex sites of the A3 plane and six vertex sites and one center site of the B3 plane, and Al is located at one center site of the A3 plane.

In the case of $Al_1Ga_2N_3$ shown in FIG. 3 (B), Ga is located at three vertex sites and one center site of the A3 and B3 planes, and Al is located at three vertex sites of the A3 and B3 planes.

In the case of $Al_1Ga_1N_2$ shown in FIG. 3 (C), Ga is located at three vertex sites and one center site of the A3 plane and three vertex sites of the B3 plane, and Al is located at three vertex sites of the A3 plane and three vertex sites and one center site of the B3 plane.

In the case of $Al_2Ga_1N_3$ shown in FIG. 3 (D), Ga is located at three vertex sites of the A3 and B3 planes, Al is located at three vertex sites and one center site of the A3 and B3 planes. This is equivalent to swapping the positions of Al and Ga in $Al_1Ga_2N_3$ shown in FIG. 3 (B).

In the case of $Al_5Ga_1N_6$ shown in FIG. 3 (E), Ga is located at one center site of the A3 plane, Al is located at six vertex sites of the A3 plane and six vertex sites and one center site of the B3 plane. This is equivalent to swapping the positions of Al and Ga in $Al_1Ga_5N_6$ shown in FIG. 3 (A).

In each of FIGS. 3(A)-3(E), assuming another hexagon whose center has moved to any one of the six vertices of the hexagon, it can be seen that Al or Ga located at the six vertex sites of the A3 plane is equivalent to Al or Ga located at the three vertex sites and the one center site of the A3 plane, and Al or Ga located at the one center of the A3 plane is equivalent to Al or Ga located at the three vertex sites of the A3 plane. The same applies to the B3 plane. In addition, in each of FIGS. 3(A), 3(C) and 3(E), A3 and B3 planes may be replaced with each other.

In each of FIGS. 3(A)-3(E), in both A3 and B3 planes, the atomic arrangement of Al and Ga is maintained in symmetry. Even if the center of the hexagon is moved, the atomic arrangement of Al and Ga is maintained in symmetry.

Furthermore, in the A3 and B3 planes of FIGS. 3(A)-3(E), when the hexagonal site plane is arranged repeatedly in a honeycomb shape, looking at each site in a direction parallel to the (0001) plane, for example, in [11-20] direction or [10-10] direction, the state in which Al and Ga is located periodically repeatedly or either Al or Ga is located continuously appears. Therefore, it can be seen that an atomic arrangement will be the periodic and symmetric atomic arrangement in the respective cases.

Hereinafter, $Al_{x1}Ga_{1-x1}N$ of the AlN mole fraction x1 (x1=1/6, 1/3, 1/2, 2/3, 5/6) corresponding to AlGaN composition ratios of above-mentioned 1) to 5) is referred to as the "first metastable AlGaN", for convenience of explanation. In the first metastable AlGaN, the atomic arrangement of Al and Ga becomes a periodic and symmetric arrangement, resulting in an energetically stable AlGaN.

Next, when the site plane indicated by the hexagon shown in FIG. 1 is extended to 2 unit cells (4 monolayers), there are two planes for each of the site planes of the Group 3 element (A3 plane, B3 plane) and two planes for each of the site planes of the Group 5 element (A5 plane, B5 plane), respectively and there are 12 sites for atoms of the Group 3 element (Al, Ga) and 12 sites for atoms of the Group 5 element (N) per 2 unit cells.

Therefore, as AlGaN composition ratios expressed by the integer ratio excluding GaN and AlN, the following six combinations exist in addition to the AlGaN composition ratios of above-mentioned 1) to 5).

6) $Al_1Ga_{11}N_{12}$ (=GaN+$Al_1Ga_5N_6$)
7) $Al_3Ga_9N_{12}$ (=$Al_1Ga_3N_4$=$Al_1Ga_5N_6$+$Al_1Ga_2N_3$)
8) $Al_5Ga_7N_{12}$ (=$Al_1Ga_2N_3$+$Al_1Ga_1N_2$)
9) $Al_7Ga_5N_{12}$ (=$Al_1Ga_1N_2$+$Al_2Ga_1N_3$)
10) $Al_9Ga_3N_{12}$ (=$Al_3Ga_1N_4$=$Al_2Ga_1N_3$+$Al_5Ga_1N_6$)
11) $Al_{11}Ga_1N_{12}$ (=$Al_5Ga_1N_6$+AlN)

However, since these six AlGaN composition ratios of 6) to 11) are combinations of two AlGaN composition ratios among the first metastable AlGaN, GaN and AlN, located before and after them, the c-axis symmetry is likely to be disturbed, and the stability is lowered than the first metastable AlGaN. But these six AlGaN are more stable than AlGaN in a random asymmetric arrangement state because the symmetry of the atomic arrangement of Al and Ga in the A3 and B3 planes is the same as that in the first metastable AlGaN. Hereinafter, $Al_{x2}Ga_{1-x2}N$ of the AlN mole fraction x2 (x2=1/12, 1/4, 5/12, 7/12, 3/4, 11/12) corresponding to AlGaN composition ratios of above-mentioned 6) to 11) is referred to as the "second metastable AlGaN", for convenience of explanation. As described above, the first and second metastable AlGaN have a stable structure due to the symmetry of the atomic arrangement of Al and Ga in the crystalline structure. Hereinafter, the first and second metastable AlGaN are collectively referred to as "metastable AlGaN".

To grow AlGaN with maintaining constant crystal quality it is required to perform crystal growth at a high temperature of 1000° C. or higher. However, it is assumed that Ga moves around at 1000° C. or higher even after atoms reach the sites of the crystal surface. On the other hand, since Al tends to adsorb to the surface unlike Ga, the movement after entering the site is strongly restricted though it is considered to move somewhat.

Therefore, even though $Al_1Ga_5N_6$ of above-mentioned 1), $Al_1Ga_{11}N_{12}$ of above-mentioned 6), and $Al_1Ga_3N_4$ of above-mentioned 7) are the metastable AlGaN, since AlN mole fractions are all less than or equal to 25% and Ga composition ratios are high, Ga movement is intense at a growth temperature around 1000° C., the symmetry of atomic arrangement is disturbed, and the atomic arrangement of Al and Ga is close to random condition. As a result, it is considered that the stability described above is reduced compared with other metastable AlGaN.

Furthermore, the present invention provides the nitride semiconductor ultraviolet light-emitting element having the fifth feature in addition to the above-described second or fourth feature, wherein the second Ga-rich region in the well layer has a metastable well region composed of a metastable AlGaN in which an AlGaN composition ratio is an integer ratio of $Al_1Ga_1N_2$ or $Al_5Ga_7N_{12}$ or $Al_1Ga_2N_3$ or $Al_1Ga_3N_4$, when the first metastable p-type region in the first Ga-rich region is composed of a p-type metastable AlGaN in which an AlGaN composition ratio is an integer ratio of $Al_5Ga_1N_6$ or $Al_3Ga_1N_4$, or the second Ga-rich region in the well layer has a metastable well region composed of a metastable AlGaN in which an AlGaN composition ratio is an integer ratio of $Al_5Ga_7N_{12}$ or $Al_1Ga_2N_3$ or $Al_1Ga_3N_4$, when the first metastable p-type region in the first Ga-rich region is composed of a p-type metastable AlGaN in which an AlGaN composition ratio is an integer ratio of $Al_2Ga_1N_3$.

According to the nitride semiconductor ultraviolet light-emitting element having the above-described fifth feature, it is expected that a nitride semiconductor ultraviolet light-emitting element having the desired emission characteristic is stably produced by utilizing the metastable well region formed in the second Ga-rich region in the well layer, which is composed of the metastable AlGaN as described above, to suppress the characteristic variation caused by the drift of the crystal growth apparatus or the like.

Furthermore, according to the nitride semiconductor ultraviolet light-emitting element having the above-described fifth feature, as a suitable combination of the metastable AlGaN formed in the second Ga-rich region, in which the peak emission wavelength is within a range of 250 nm to 310 nm, according to the metastable AlGaN having the AlN mole fraction of 83.3%, 75% or 66.7% stably formed in the first Ga-rich region, there are five metastable AlGaNs in which the AlGaN composition ratio is $Al_1Ga_1N_2$ or $Al_5Ga_7N_{12}$ or $Al_1Ga_2N_3$ or $Al_1Ga_3N_4$ or $Al_1Ga_5N_6$. That is, any one of the five metastable AlGaNs can be selected depending on the target value of the peak emission wavelength. The details of the peak emission wavelengths that $Al_1Ga_1N_2$, $Al_5Ga_7N_{12}$ and $Al_1Ga_2N_3$ out of the five metastable AlGaNs can take respectively will be described later.

The metastable AlGaN, in which the AlGaN composition ratio is $Al_1Ga_1N_2$ or $Al_5Ga_7N_{12}$ or $Al_1Ga_2N_3$ or $Al_1Ga_3N_4$ or $Al_1Ga_5N_6$, is present in the second Ga-rich region, so that variation in amount of Ga supplied into the second Ga-rich region are absorbed in the metastable AlGaN. That is, in the second Ga-rich region, when the Ga supply amount increases, the metastable AlGaN increases, and when the Ga supply amount decreases, the metastable AlGaN decreases, and as a result, the variation of the AlN mole fraction in the second Ga-rich region is suppressed. Accordingly, in the second Ga-rich region, the variation of the Ga supply amount due to the drift of the crystal growth apparatus or the like is absorbed, and the metastable AlGaN in which the AlGaN composition ratio is $Al_1Ga_1N_2$(AlN mole fraction is 50% (½)) or $Al_5Ga_7N_{12}$ (AlN mole fraction is 41.7% (5/12)) or $Al_1Ga_2N_3$(AlN mole fraction is 33.3% (⅓)) or $Al_1Ga_3N_4$ (AlN mole fraction is 25% (¼)) or $Al_1Ga_5N_6$(AlN mole fraction is 16.7% (⅙)) is stably formed. That is, the variation of the AlN mole fraction in the second Ga-rich region is suppressed against the variation of the Ga supply amount.

Furthermore, the present invention provides the nitride semiconductor ultraviolet light-emitting element having the sixth feature in addition to any one of the above-described first to fifth features, wherein the active layer has a multi-quantum-well structure including two or more well layers, and that a barrier layer composed of AlGaN-based semiconductor is present between two of the well layers.

According to the nitride semiconductor ultraviolet light-emitting element having the above-described sixth feature, the active layer has a multi-quantum-well structure, and the luminous efficiency can be expected to be improved as compared with the luminous efficiency when only one well layer is used.

Furthermore, in the nitride semiconductor ultraviolet light-emitting element having the above-described sixth feature, it is preferable that the barrier layer is composed of an AlGaN-based semiconductor and has inclined regions inclined with respect to the (0001) plane connecting between adjacent terraces of the multi-step terraces, and terrace regions other than the inclined regions, respectively and that the inclined regions in the barrier layer have a fourth Ga-rich region in which an AlN mole fraction is locally lower than an AlN mole fraction in the terrace regions of the barrier layer.

According to the above preferred implementation, the carrier localization can occur in the fourth Ga-rich region of the barrier layer as well as in the first Ga-rich region of the electron blocking layer, the second Ga-rich region of the well layer and the third Ga-rich region of the p-type cladding layer. Therefore, when supplying the carriers (electrons and holes) to the second Ga-rich region of the inclined region, in which light emission is concentrated in the well layer, from the n-type layer and the p-type layer, respectively it can be done efficiently through the fourth Ga-rich regions of the barrier layer.

Here, in the multi-quantum-well structure having two or more well layers, since the emission intensity is large in the well layer at the most p-type layer side, and the fourth Ga-rich region is formed in the barrier layer at the n-type layer side of the above-mentioned well layer, it can be done more efficiently to supply the carriers to the well layer as described above.

Furthermore, it is preferable that the nitride semiconductor ultraviolet light-emitting element having any one of the above-described first to six features further comprises an underlying part containing a sapphire substrate, the sapphire substrate has a main surface inclined by a predetermined angle with respect to the (0001) plane, the light-emitting element structure part is formed above the main surface, and each semiconductor layer from the main surface of the sapphire substrate to the contact layer in the p-type layer is an epitaxially grown layer having a surface on which multi-step terraces parallel to the (0001) plane are formed.

According to the above preferred implementation, a miscut sapphire substrate can be used to perform epitaxial growth such that multi-step terraces appear on the surface of each layer from the main surface of the sapphire substrate to the contact layer in the p-type layer, thereby realizing the nitride semiconductor ultraviolet light-emitting element of the above-described feature.

Effect of the Invention

According to the nitride semiconductor ultraviolet light-emitting element having any one of the above-described features, the supply of holes from the p-type layer side to the well layer can be done efficiently through the inclined regions of the electron blocking layer, the amount of holes that reach the inclined regions of the well layer, which are the localized centers of radiative recombination, is greatly increased, and it is possible to suppress the decrease in internal quantum efficiency and the occurrence of double emission peaks, which have been problems in the conventional nitride semiconductor ultraviolet light-emitting element.

DESCRIPTION OF EMBODIMENT

Figure 1:
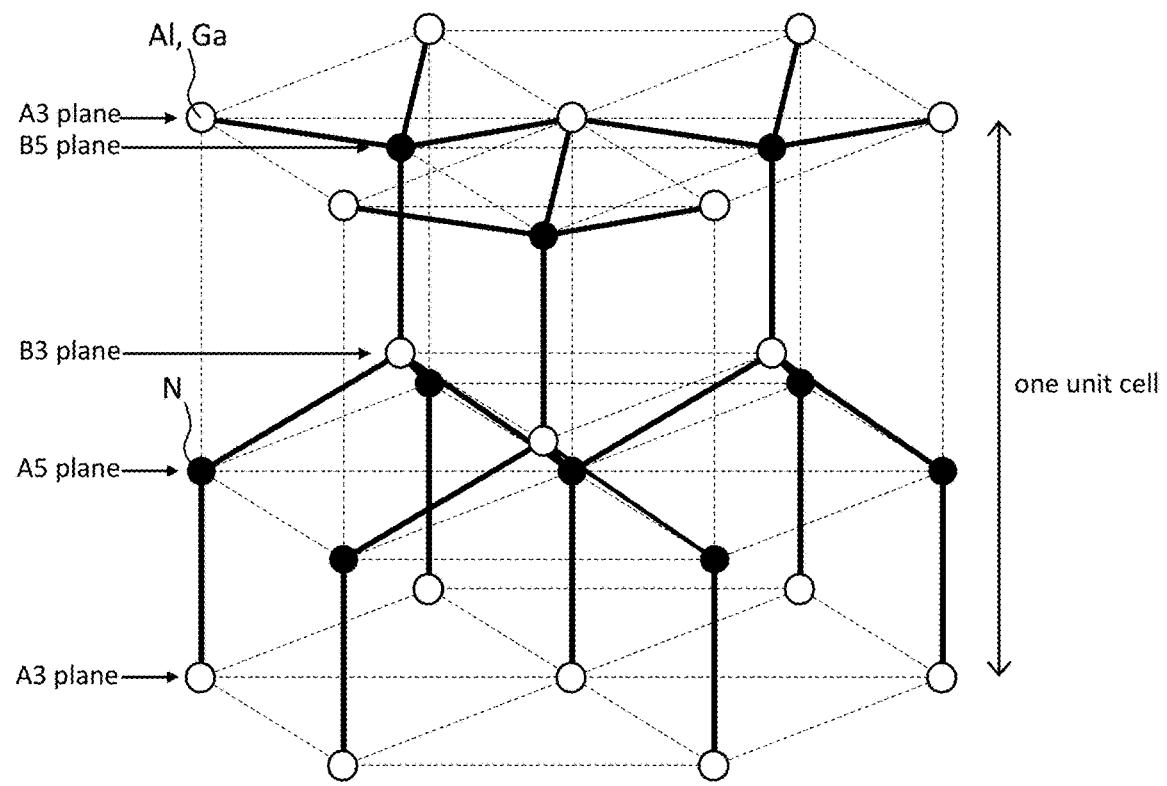
FIG. 1 is a diagram schematically illustrating the wurtzite crystal structure of AlGaN.
Figure 2:
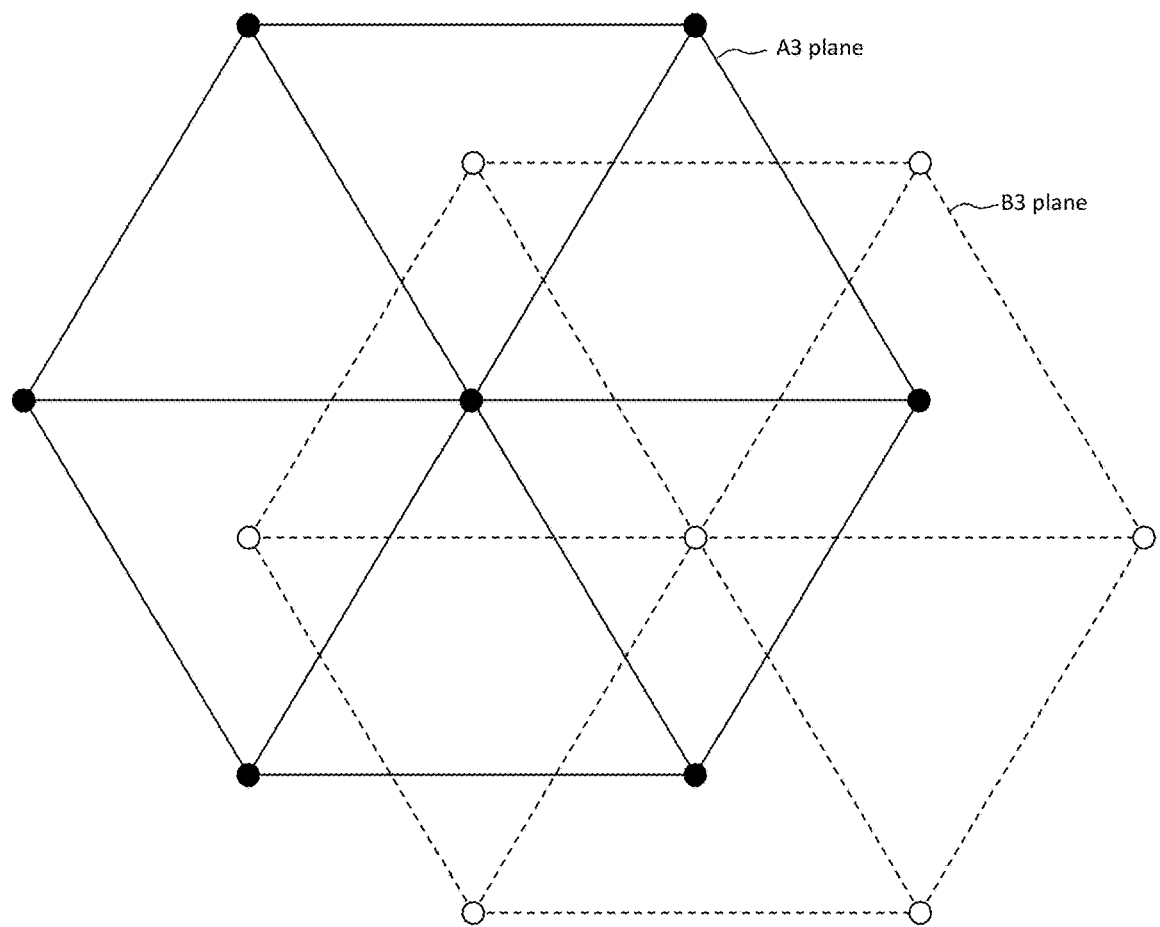
FIG. 2 is a plan view showing the positional relationship between each site of A plane and each site of B plane as viewed from the c-axis direction of the wurtzite crystal structure shown in FIG. 1.
Figure 3:
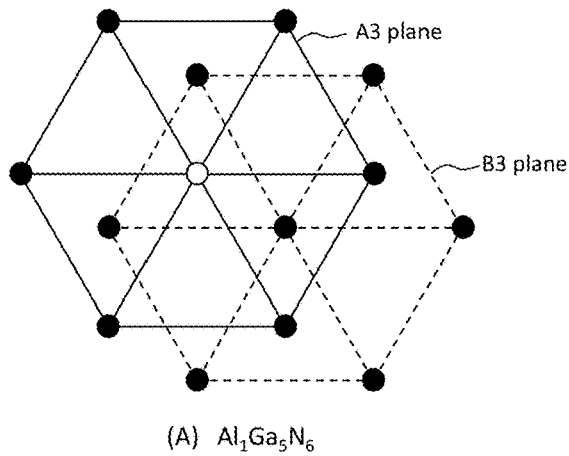
FIG. 3 is a diagram schematically showing the arrangement of Al and Ga on A3 plane and B3 plane in each of five combinations of AlGaN composition ratios represented by integer ratios.
Figure 3:
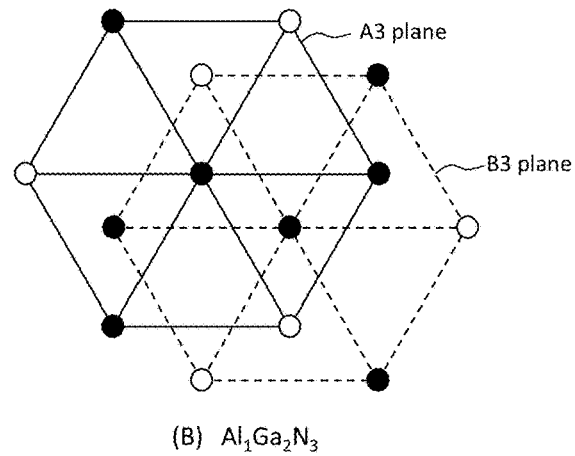
Figure 3:
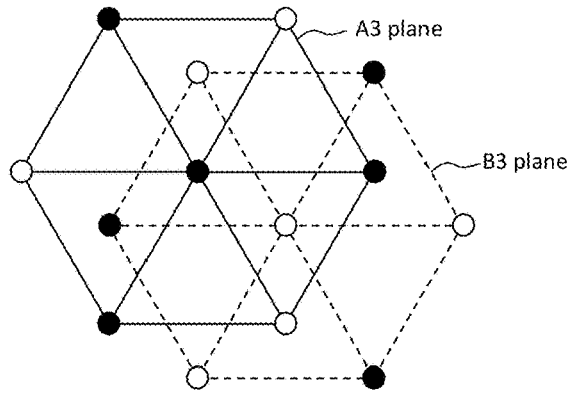
Figure 3:
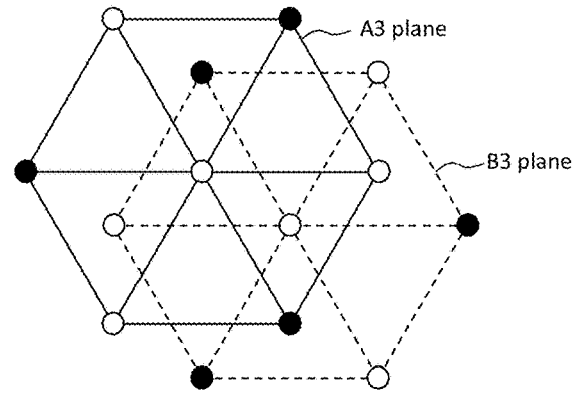
Figure 3:
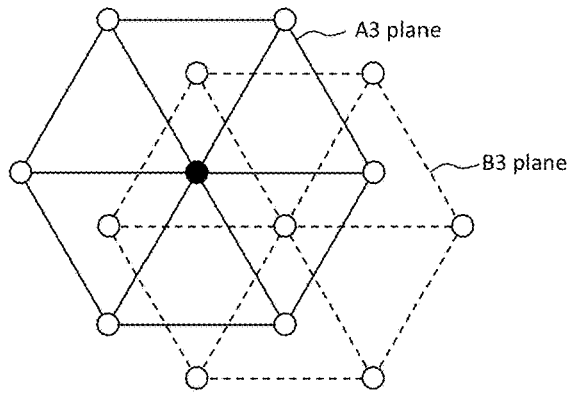

A nitride semiconductor ultraviolet light-emitting element (hereinafter, simply referred to as a "light-emitting element") according to an embodiment of the present invention will be described with reference to the drawings. In the drawings as pattern diagram used in the following description, the dimensional ratios of each part are not necessarily the same as those of the actual elements because the essential part is emphasized to schematically show the invention for ease of understanding of the description. Hereinafter, in the present embodiment, description will be made on the assumption that the light-emitting element is a light-emitting diode.

First Embodiment

<Element Structure of Light-Emitting Element>

Figure 4:
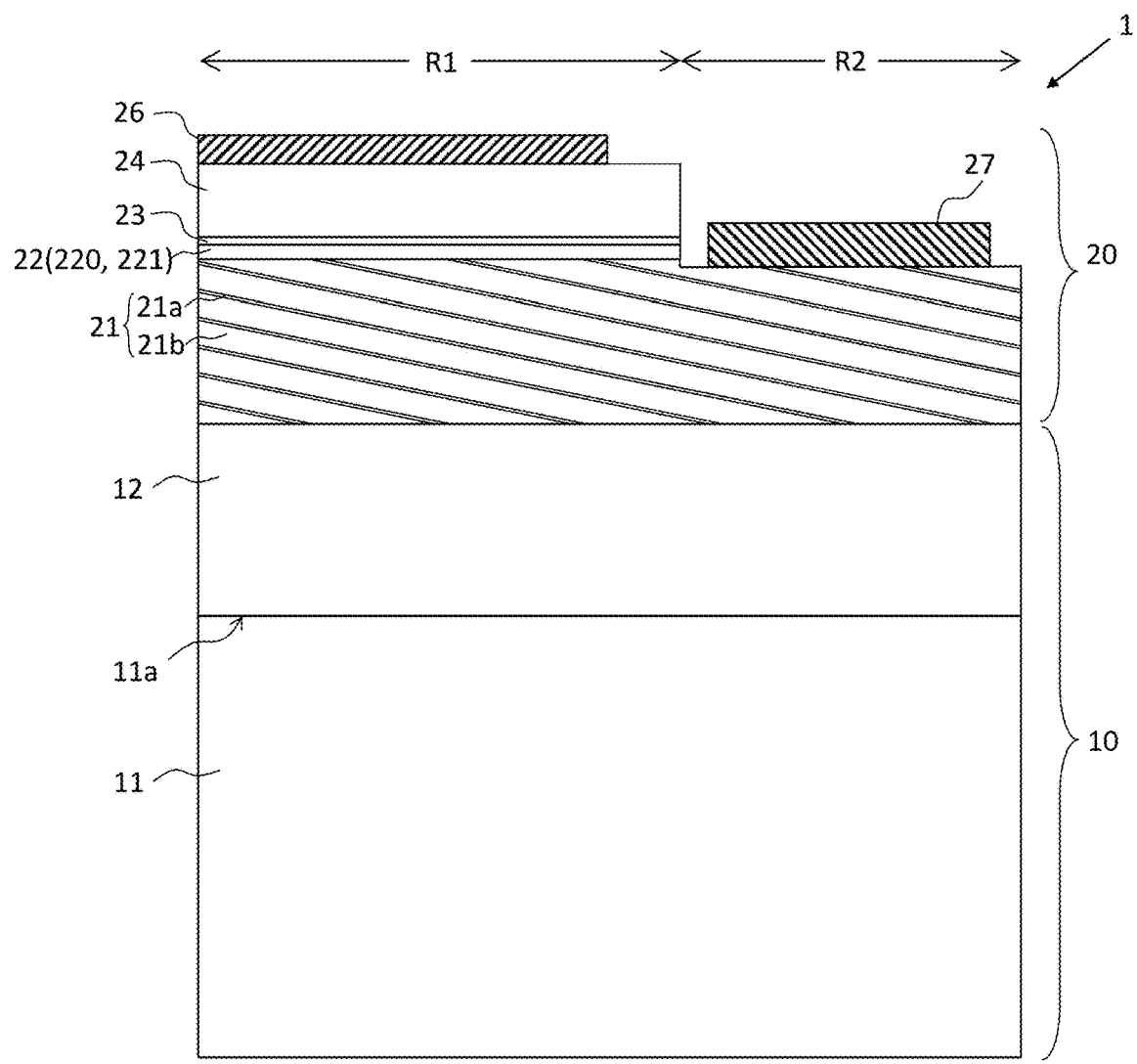
FIG. 4 is a fragmentary cross-sectional view schematically showing an exemplary configuration of a nitride semiconductor ultraviolet light-emitting element according to the first embodiment of the present invention.

As shown in FIG. 4, the light-emitting element 1 of the first embodiment includes an underlying part 10 including a sapphire substrate 11, and a light-emitting element structure part 20 including a plurality of AlGaN-based semiconductor layers 21-24, a p-electrode 26, and an n-electrode 27. The nitride semiconductor light-emitting element 1 is mounted (flip-chip mounted) on a mounting base (a submount or the like) with facing a side of the light-emitting element structure part 20 (an upper side in FIG. 4) toward the mounting base, and light is extracted from a side of the underlying part 10 (a lower side in FIG. 4). In this specification, for convenience of explanation, a direction perpendicular to the main surface 11a of the sapphire substrate 11 (or the upper surface of the underlying part 10 and the respective AlGaN-based semiconductor layers 21 to 24) is referred to as "up and down direction" (or "vertical direction"), and a direction from the underlying part 10 to the light-emitting element structure part 20 is set to an upward direction and an opposite direction thereof is defined as a downward direction. A plane parallel to the vertical direction is referred to as a "first plane". A plane parallel to the main surface 11a of the sapphire substrate 11 (or the upper surface of the underlying part 10 and the respective AlGaN-based semiconductor layers 21 to 24) is referred to as a "second plane," and a direction parallel to the second plane is referred to as a "lateral direction."

The underlying part 10 is configured with the sapphire substrate 11 and an AlN layer 12 formed directly on the main surface 11a of the sapphire substrate 11. The sapphire substrate 11 is a slightly inclined substrate, in which the main surface 11a is inclined at an angle (miscut angle) within a certain range (e.g., from 0 degree to about 6 degrees) with respect to the (0001) plane and the multi-step terraces appear on the main surface 11a.

The AlN layer 12 is composed of AlN crystal epitaxially grown on the main surface of the sapphire substrate 11, the AlN crystal has an epitaxial crystal orientation relationship with respect to the main surface 11a of the sapphire substrate 11. Specifically, for example, the AlN crystal is grown so that the C-axis direction of the sapphire substrate 11 (<0001> direction) and the C-axis direction of the AlN crystal is aligned. The AlN crystal constituting AlN layer 12 may be an AlN-based semiconductor layer which contains a trace amount of Ga or another impurity. In the present embodiment, the film thickness of the AlN layer 12 is assumed to be about 2 μm to 3 μm. The structure of the underlying part 10 and a substrate to be used are not limited to those described above. For example, an AlGaN-based semiconductor layer having an AlN mole fraction greater than or equal to the AlN mole fraction of the AlGaN-based semiconductor layer 21 may be provided between the AlN layer 12 and the AlGaN-based semiconductor layer 21.

The AlGaN-based semiconductor layers 21-24 of the light-emitting element structure part 20 comprises a structure having an n-type cladding layer 21 (n-type layer), an active layer 22, an electron blocking layer 23 (p-type layer), and a p-type contact layer 24 (p-type layer) stacked in order from the underlying part 10 side by epitaxially growing them in order.

In the present embodiment, the AlN layer 12 of the underlying part 10, and the n-type cladding layer 21, each semiconductor layer within the active layer 22, and the electron blocking layer 23 of the light-emitting element structure part 20, which are epitaxially grown in order from the main surface 11a of the sapphire substrate 11, has a surface on which multi-step terraces parallel to the (0001) plane originating from the main surface 11a of the sapphire substrate 11 are formed. Since the p-type contact layer 24 of the p-type layer are formed on the electron blocking layer 23 by epitaxial growth, the same multi-step terraces can be formed, but the p-type contact layer 24 does not necessarily need to have surfaces on which the same multi-step terraces are formed.

As shown in FIG. 4, in the light-emitting element structure part 20, the active layer 22, the electron blocking layer 23, and the p-type contact layer 24 are formed on the first region R1 of the upper surface of the n-type cladding layer 21 as a result of removing portions of them stacked on the second region R2 of the upper surface of the n-type cladding layer 21 by etching or the like. The upper surface of the n-type cladding layer 21 is exposed in the second region R2 except for the first region R1. The upper surface of the n-type cladding layer 21 may differ in height between the first region R1 and the second region R2, as schematically shown in FIG. 4, where the upper surface of the n-type cladding layer 21 is individually defined in the first region R1 and the second region R2.

The n-type cladding layer 21 is composed of the n-type AlGaN-based semiconductor, and stratiform regions, in which AlN mole fraction is locally lower within the n-type cladding layer 21, are present uniformly dispersed in the n-type cladding layer 21. As described above in the background art section, the stratiform regions 21a have a locally reduced bandgap energy which facilitates localization of carriers, and function as a low-resistance current path. The region other than the stratiform region in the n-type cladding layer 21 is referred to as an n-type body region 21b. The AlN mole fraction of the stratiform region is lower than that of the n-type body region 21b due to the mass-transfer of Ga from the n-type body region.

In the present embodiment, the film thickness of the n-type cladding layer 21 is assumed to be about 1 µm to 2 µm as with the film thickness adopted in the common nitride semiconductor ultraviolet light-emitting element, but the film thickness may be about 2 µm to 4 µm.

Figure 16:
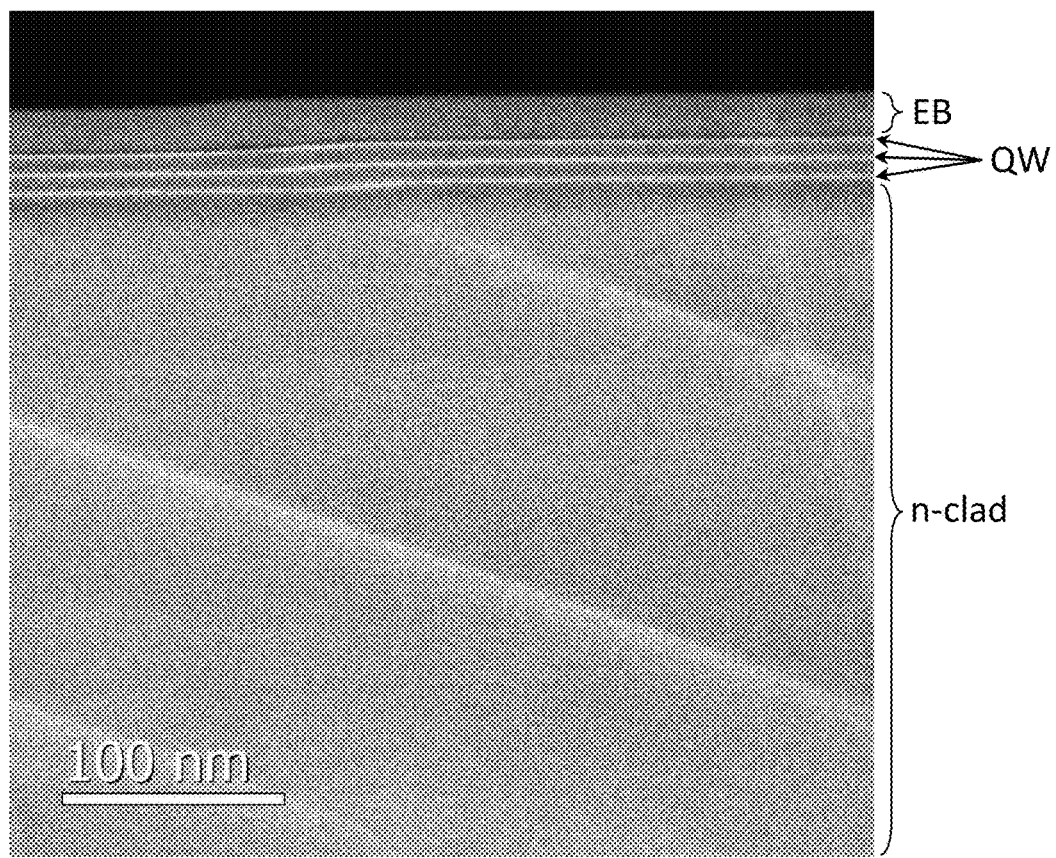
FIG. 16 is a HAADF-STEM image showing the cross-sectional construction in the n-type cladding layer, the active layer and the electron blocking layer of the conventional nitride semiconductor ultraviolet light-emitting element.

As to the stratiform region 21a of the n-type cladding layer 21, a plurality of layers is vertically separated from each other, as one layer is schematically indicated by a double line in FIG. 4. Furthermore, in one first plane (for example, the cross section shown in FIG. 4) which is parallel to the vertical direction, at least a part of the extending direction of the stratiform region 21a is inclined with respect to the lateral direction (the extending direction of an intersection line of the first plane and the second plane). The above characteristics of the stratiform region 21a are also confirmed in the HAADF-STEM image of the n-type cladding layer of the conventional nitride semiconductor ultraviolet light-emitting element shown in FIG. 16.

On the first plane shown in FIG. 4, each layer of the stratiform regions 21a is schematically illustrated by a parallel line (double line), the inclination angle formed between the extending direction and the lateral direction is not necessarily the same between the respective stratiform regions 21a and may vary depending on the position even within the same stratiform region 21a, so that the stratiform region 21a on the first plane do not necessarily extend linearly. Furthermore, the inclination angle is also changed by the orientation of the first plane. Therefore, a part of the stratiform region 21a may intersect with or diverge from another stratiform region 21a on the first plane.

Each stratiform region 21a is shown as one line (double line) on the first plane in FIG. 4, but also extends in a direction perpendicular to the first plane in a direction parallel or inclined to the second plane and has a two-dimensional extension. Accordingly a plurality of stratiform regions 21a exist in stripes on a plurality of second planes in the n-type cladding layer 21.

The stratiform region 21a has a locally lower AlN mole fraction in the n-type cladding layer 21, as described above. That is, the AlN mole fraction of the stratiform region 21a is relatively low with respect to the AlN mole fraction of the n-type body region 21b. In addition, when the AlN mole fractions of both regions are asymptotically consecutive in the vicinity of the boundary between the stratiform region 21a and the n-type body region 21b, the boundary between both regions cannot be clearly defined.

The AlN mole fraction of the stratiform region 21a in the n-type cladding layer 21 is set according to the AlN mole fraction in the well layer 220, as will be described later. The AlN mole fraction in the well layer 220 is set according to the target value of the peak emission wavelength.

The AlN mole fraction of the n-type body region 21b is set to be higher than that of the stratiform region 21a by 1.5% or more, preferably 2% or more, more preferably 4% or more. It is preferable that the difference in AlN mole fraction between the stratiform region 21a and the n-type body region 21b in the n-type cladding layer 21 is 4% to 5% or more in order to sufficiently ensure the effect of carrier localization in the stratiform region 21a, but the carrier localization can be stably realized if the difference in AlN mole fraction is 1.5% to 2% or more.

Furthermore, as one preferred implementation, the n-type AlGaN region of the metastable AlGaN in which the AlGaN composition ratio is an integer ratio of $Al_3Ga_1N_4$(AlN mole fraction: ¾=75%) or $Al_2Ga_1N_3$(AlN mole fraction: ⅔=66.7%) or $Al_7Ga_5N_{12}$ (AlN mole fraction: 7/12=58.3%) or $Al_1Ga_1N_2$(AlN mole fraction: ½=50%) is dominantly present in the stratiform regions according to the AlN mole fraction of the well layer 220. In the following, the n-type AlGaN region of the metastable AlGaN, in which the AlGaN composition ratio is an integer ratio of $Al_3Ga_1N_4$, $Al_2Ga_1N_3$, $Al_7Ga_5N_{12}$ or $Al_1Ga_1N_2$, present in the stratiform region 21a is referred to as a "metastable n-type region" for convenience. It is preferable that the metastable n-type region is dominantly present in the stratiform regions as one implementation, but the stratiform regions 21a may include a region having an AlN mole fraction intermediate between the respective AlN mole fractions of the metastable n-type region and the n-type body region, and a portion of the stratiform regions 21a may include many regions of the intermediate AlN mole fraction.

In the case where the metastable n-type region haivng the above-mentioned AlGaN composition ratio is dominantly present in the stratiform regions, it is preferable that the AlN mole fraction of the n-type body region (the average AlN mole fraction obtained by averaging the variations in the AlN mole fraction occurring in the n-type body region due to the mass-transfer of Ga) is set within a range of 77% to 82% when the AlN mole fraction of the metastable n-type region is 75%, within a range of 69% to 74% when the AlN mole fraction of the metastable n-type region is 66.7%, within a range of 60% to 66% when the AlN mole fraction of the metastable n-type region is 58.3%, or within a range of 52% to 57% when the AlN mole fraction of the metastable n-type region is 50%. Such preferred implementations ensure that the AlN mole fraction difference between the stratiform region 21a and the terrace region TA in the n-type cladding layer 21 is about 2% or more. However, the AlN mole fraction of the n-type body region can take any value within the range of approximately 51% to 83%, depending on the AlN mole fraction in the well layer 220, even if it is out of the above four preferred ranges, as long as the stratiform regions 21a capable of localizing carriers are formed in the n-type cladding layer 21.

The active layer 22 has a multi-quantum-well structure in which two or more well layers 220 composed of an AlGaN-based semiconductor, and one or more barrier layers 221 composed of an AlGaN-based semiconductor or an AlN-based semiconductor are stacked alternately. The barrier layer 221 is not necessarily provided between the lowermost well layer 220 and the n-type cladding layer 21. In addition, in the present embodiment, the barrier layer 221 is not provided between the uppermost well layer 220 and the electron blocking layer 23, but an AlGaN or AlN layer having a thinner thickness and a higher AlN mole fraction than the barrier layer 221 may be provided there.

The electron blocking layer 23 is composed of a p-type AlGaN-based semiconductor. The p-type contact layer 24 is composed of a p-type AlGaN-based semiconductor or p-type GaN based semiconductor. The p-type contact layer 24 is typically composed of p-GaN.

Figure 5:
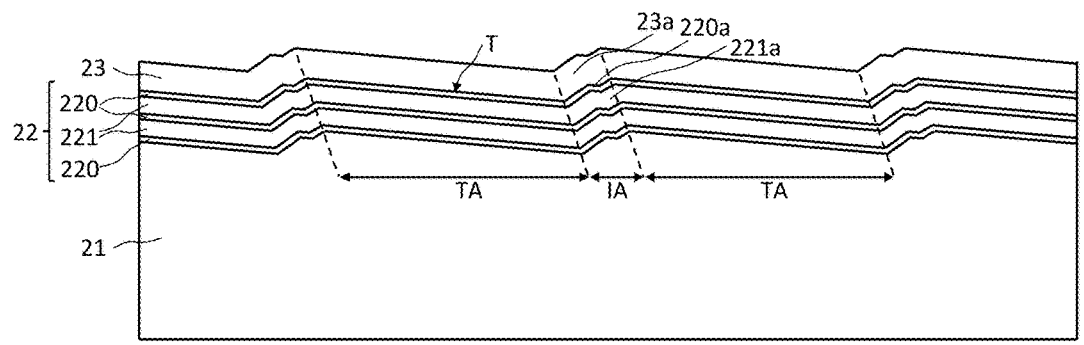
FIG. 5 is a fragmentary cross-sectional view schematically showing an exemplary laminated structure of the main part including an active layer of the nitride semiconductor ultraviolet light-emitting element shown in FIG. 4.

FIG. 5 schematically shows an exemplary laminated structure (multi-quantum-well structure) of the well layer 220 and the barrier layer 221 in the active layer 22. FIG. 5 illustrates an example for three well layers 220 and two barrier layers 221. The uppermost well layer 220 is located between the electron blocking layer 23 and the upper barrier layer 221, the middle well layer 220 is located between the upper barrier layer 221 and the lower barrier layer 221, and the lowermost well layer 220 is located between the lower barrier layer 221 and the n-type cladding layer.

The structure shown in FIG. 5 in which the terrace T in the well layer 220, the barrier layer 221 and the electron blocking layer 23 grows in multi-steps is a known structure as disclosed in Non-Patent Documents 1 and 2 described above. The inclined region IA inclined with respect to the (0001) plane is formed between the terraces T adjacent in the lateral direction in the respective layers as described above. A region other than the inclined region IA, which is sandwiched vertically between the terraces T, is referred to as a terrace region TA. In the present embodiment, the tread (distance between adjacent inclined regions IA) of one terrace T is assumed to be several tens nm to several hundred nm. Therefore, the (0001) surface shown stepwise on the inclined region IA is distinguished from the terrace surface of the multi-step terraces T.

As schematically shown in FIG. 5, the first Ga-rich region 23a having a lower AlN mole fraction than the terrace region TA is formed in the inclined region IA in the electron blocking layer 23, and the second Ga-rich region 220a having a lower AlN mole fraction than the terrace region TA is formed in the inclined region IA in each layer of the well layers 220. In each layer of the barrier layers 221, if the barrier layers 221 are composed of the AlGaN-based semiconductor and their AlN mole fraction is not 100%, the fourth Ga-rich region 221a having a lower AlN mole fraction than the terrace region TA is formed in the inclined region IA as well as the electron blocking layer 23 and the well layers 220. In the respective layers of the electron blocking layer 23, the well layers 220 and the barrier layers 221, the first Ga-rich region 23a, the second Ga-rich region 220a, and the fourth Ga-rich region 221a in which the AlN mole fraction is locally lower, are formed in the respective inclined regions IA due to the mass-transfer of Ga from the terrace region TA to the inclined region IA.

In the present embodiment, the film thickness of the electron blocking layer 23 is set, for example, within a range of 15 nm to 30 nm (optimally 20 nm) including the terrace region TA and the inclined region IA. The film thickness of the well layer 220 is set, for example, within a range of 1.5 unit cells to 7 unit cells including the terrace region TA and the inclined region IA. The film thickness of the barrier layer 221 is set, for example, within a range of 6 nm to 8 nm including the terrace region TA and the inclined region IA according to the target value of the peak emission wavelength of the light-emitting element 1.

The AlN mole fraction of the second Ga-rich region 220a in the well layer 220 is set according to the target value of the peak emission wavelength of the light-emitting element 1. As a preferred implementation, in the second Ga-rich region 220a of the well layer 220, the metastable well region composed of the metastable AlGaN, in which the AlGaN composition ratio is an integer ratio of $Al_1Ga_1N_2$, $Al_5Ga_7N_{12}$, $Al_1Ga_2N_3$, or $Al_1Ga_3N_4$, that is, the metastable AlGaN, in which the AlN mole fraction is 50% (½), 41.7% (5/12), 33.3% (⅓) or 25% (¼), according to the target value of the peak emission wavelength, is formed. It is preferable that the metastable well region is dominantly present in the second Ga-rich region 220a as one implementation, but the second Ga-rich region 220a may include a region having an AlN mole fraction intermediate between the respective AlN mole fractions of the metastable well region and the terrace region TA in the well layer 220. Even in such a case, the carrier localization can occur within the inclined region IA of the well layer 220.

Figure 6:
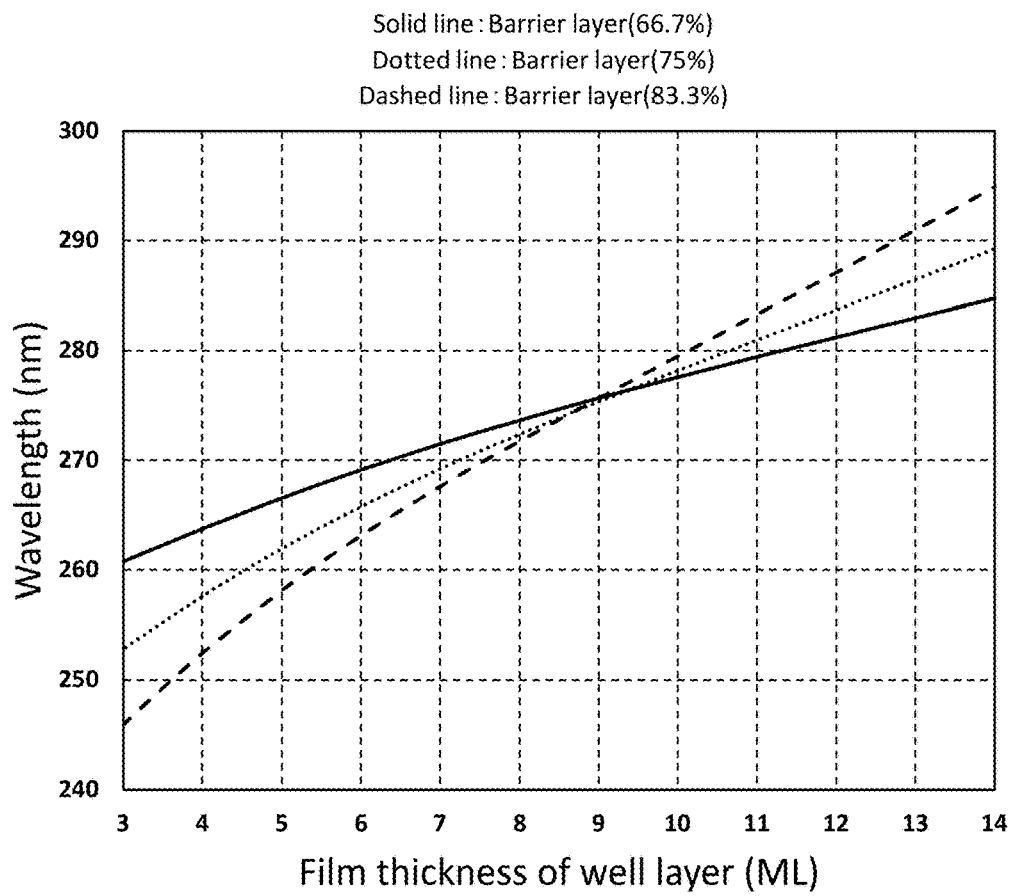
FIG. 6 is a graph showing the relationship between the emission wavelength of the quantum-well structure consisting of AlGaN well layer and AlGaN barrier layer, the film thickness of the well layer, and the AlN mole fraction of the barrier layer when the AlN mole fraction of the second Ga-rich region 220a is 50%.
Figure 7:
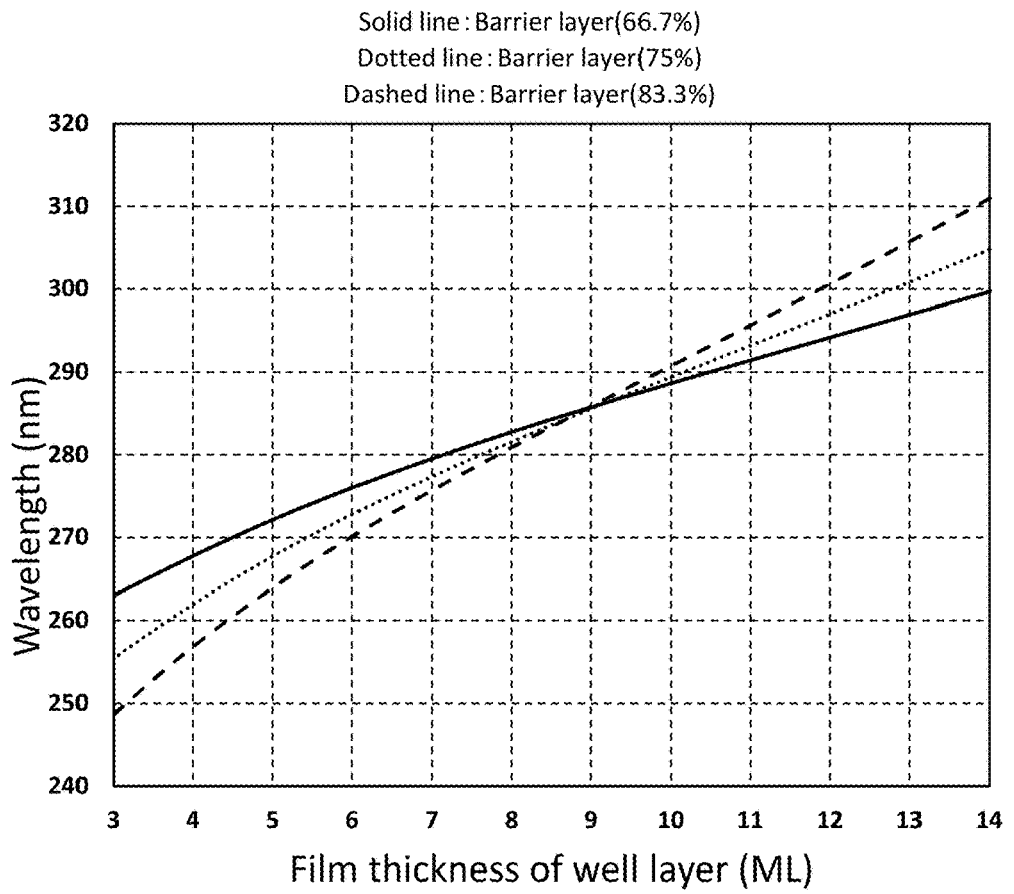
FIG. 7 is a graph showing the relationship between the emission wavelength of the quantum-well structure consisting of AlGaN well layer and AlGaN barrier layer, the film thickness of the well layer, and the AlN mole fraction of the barrier layer when the AlN mole fraction of the second Ga-rich region 220a is 41.7%.
Figure 8:
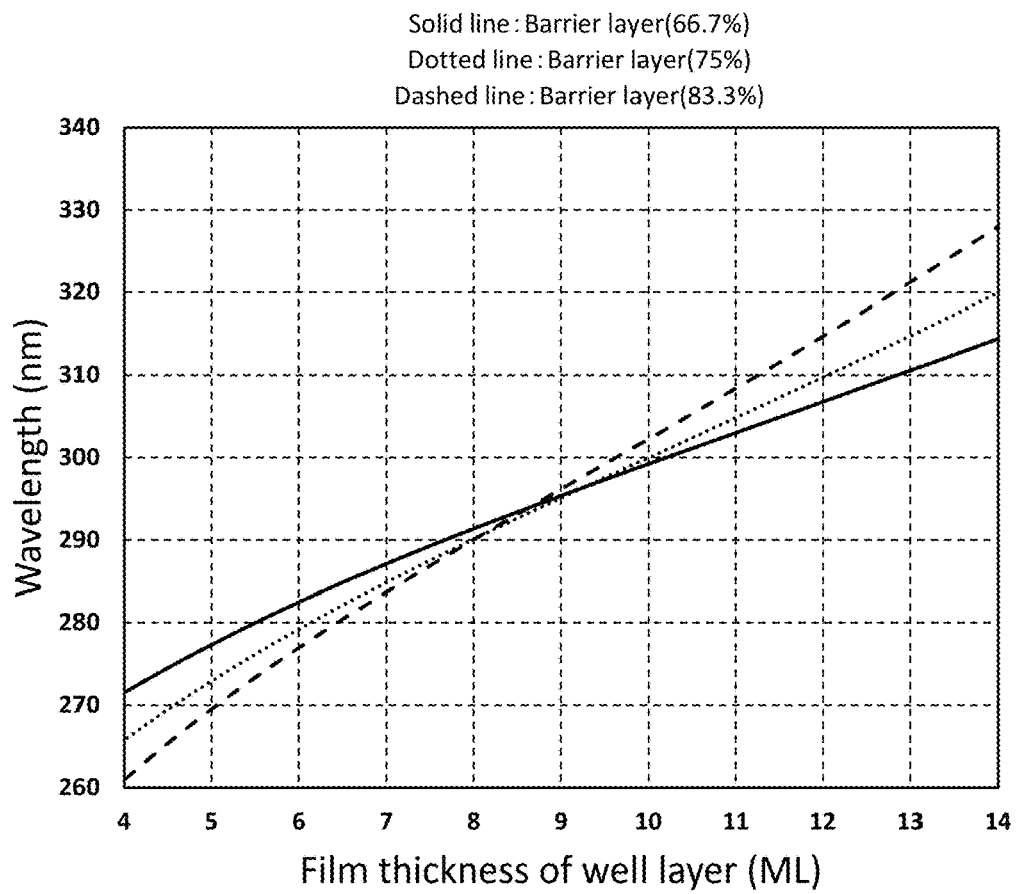
FIG. 8 is a graph showing the relationship between the emission wavelength of the quantum-well structure consisting of AlGaN well layer and AlGaN barrier layer, the film thickness of the well layer, and the AlN mole fraction of the barrier layer when the AlN mole fraction of the second Ga-rich region 220a is 33.3%.

FIGS. 6, 7 and 8 are graphical representations of the simulated emission wavelengths (corresponding to the peak emission wavelengths) obtained by changing the film thickness of the well layer within a range of 3 ML (monolayer) to 14 ML (1.5 unit cells to 7 unit cells) or 4 ML (monolayer) to 14 ML (2 unit cells to 7 unit cells) for the quantum-well structure model in which the well layer 220 and the barrier layer 221 are composed of AlGaN. As a condition of the above simulation, the AlN mole fraction of the second Ga-rich region 220a of the well layer 220 was set to 50% (½) in FIG. 6, to 41.7% (5/12) in FIG. 7 and to 33.3% (⅓) in FIG. 8, which are the AlN mole fractions of the metastable well region, and three AlN mole fractions of the fourth Ga-rich region 221a of the barrier layer 221 were set to 66.7% (⅔), 75% (¾), and 83.3 (⅚)% in each of FIGS. 6 to 8. In the simulated result shown in FIGS. 6 to 8, it is assumed that the ultraviolet light emission in the well layer 220 is remarkably generated in the inclined region IA. For this reason, it is essential that the film thickness condition of the well layer 220 is satisfied in the inclined region IA.

It can be seen from FIGS. 6 to 8 that the quantum confinement effect in the well layer 220 is increased and the emission wavelength is shortened as the film thickness of the well layer 220 is decreased within the range of 3 ML to 14 ML and that the degree of change in the emission wavelength with respect to the change in the film thickness of the well layer 220 increases as the AlN mole fraction of the barrier layer 221 increases. It can also be seen from FIG. 6 that within the above ranges of the film thickness of well layer 220 and the AlN mole fraction of the barrier layer 221, the emission wavelength varies in the range of approximately 246 nm to 295 nm when the AlN mole fraction of the second Ga-rich region 220a is 50%. It can also be seen from FIG. 7 that within the above ranges of the film thickness of well layer 220 and the AlN mole fraction of the barrier layer 221, the emission wavelength varies in the range of approximately 249 nm to 311 nm when the AlN mole fraction of the second Ga-rich region 220a is 41.7%. It can also be seen from FIG. 8 that within the above ranges of the film thickness of the well layer 220 and the AlN mole fraction of the barrier layer 221, the emission wavelength varies in the range of approximately 261 nm to 328 nm when the AlN mole fraction of the second Ga-rich region 220a is 33.3%. Furthermore, the barrier layer 221 can be made of AlN (AlN mole fraction=100%) to further extend the emission wavelength.

It can be seen from FIGS. 6 to 8 that the peak emission wavelength can be set within the range of 250 nm to 310 nm by having the metastable well region, in which the AlGaN composition ration is $Al_1Ga_1N_2$ or $Al_5Ga_7N_{12}$ or $Al_1Ga_2N_3$, formed in the second Ga-rich region 220a of the well layer 220 and by adjusting the film thickness of the well layer 220 within the range of 3 ML to 14 ML and the AlN mole fraction in the fourth Ga-rich region 221a of the barrier layer 221 within the range of 66.7% to 100% according to the AlN mole fraction of the metastable well region.

Figure 9:
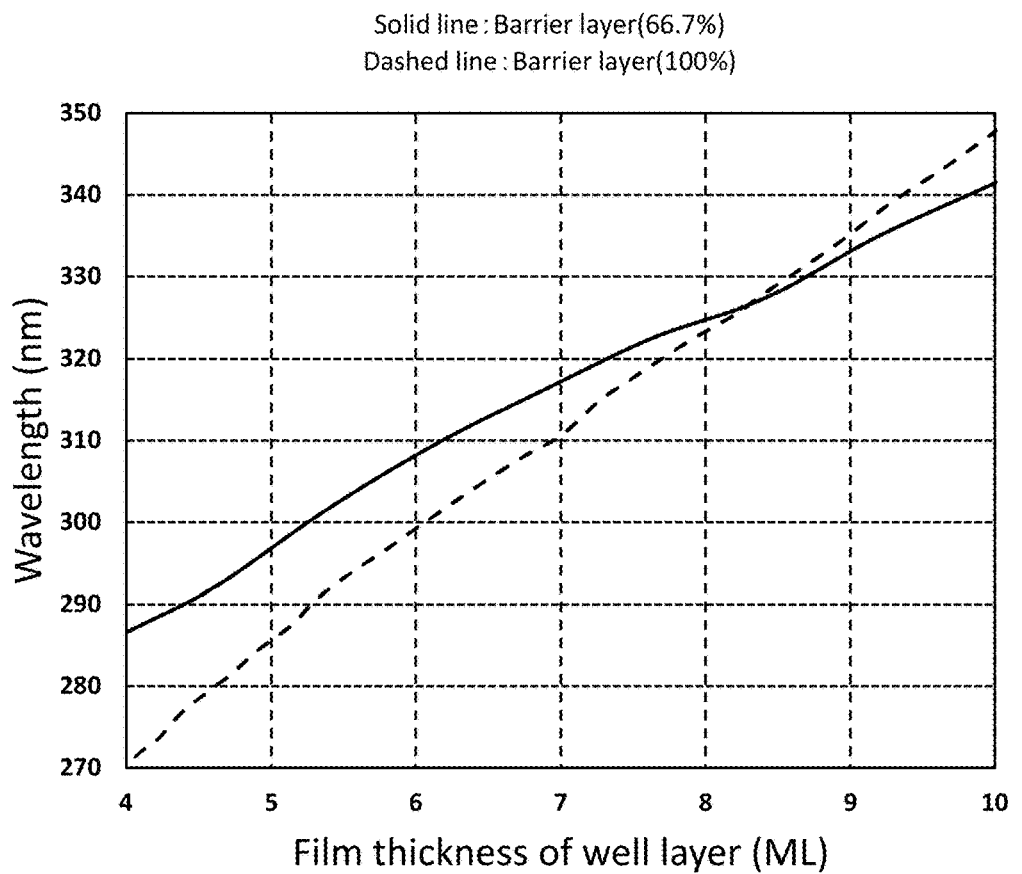
FIG. 9 is a graph showing the relationship between the emission wavelength of the quantum-well structure consisting of GaN well layer and AlGaN barrier layer, the film thickness of the well layer, and the AlN mole fraction of the barrier layer.

FIG. 9 is a graphical representation of the simulated emission wavelengths (corresponding to the peak emission wavelengths) obtained by changing the film thickness of the well layer within a range of 4 ML to 10 ML in two cases where the AlN mole fractions of the barrier layer are 66.7% (AlGaN) and 100% (AlN) for the quantum-well structure model in which the well layer 220 is composed of GaN and the barrier layer 221 is composed of AlGaN or AlN. It can be seen from FIG. 9 that the emission wavelength varies in the range of approximately 270 nm to 325 nm within the above ranges. Therefore, It can be seen that the peak emission wavelength can be set within the range of 270 nm to 310 nm by respectively adjusting the film thickness of the well layer 220 within the range of 4 ML to 10 ML and the AlN mole fraction in the fourth Ga-rich region 221a of the barrier layer 221 within the range of 66.7% to 100%, even if the well layer is composed of GaN (AlN mole fraction=0%).

It can be seen from FIG. 9 that if the target value of the peak emission wavelength is within the range of 270 nm to 310 nm, as the AlGaN composition ratio of the metastable well region formed in the second Ga-rich region 220a of the well layer 220, $Al_1Ga_3N_4$(AlN mole fraction is 25% (¼)) or $Al_1Ga_5N_6$(AlN mole fraction is 16.7% (⅙)) can also be selected in addition to $Al_1Ga_1N_2$, $Al_5Ga_7N_{12}$, and $Al_1Ga_2N_3$ shown in FIGS. 6 to 8. In this case, since the AlN mole fraction of the metastable well region is decreased from 33.3% by 8.33% (1/12), it is possible to set the AlN mole fraction of the barrier layer 221 lower than 66.7%, for example 58.3%, within the range matching the target value of the peak emission wavelength.

Furthermore, it is preferable that the AlN mole fraction of the terrace region TA of the well layer 220 is adjusted, for example, within a range of 50.1% to 54% when forming the metastable well region having the AlN mole fraction of 50% in the second Ga-rich region 220a, within a range of 41.8% to 45% when forming the metastable well region having the AlN mole fraction of 41.7% in the second Ga-rich region 220a, within a range of 33.4% to 37% when forming the metastable well region having the AlN mole fraction of 33.3% in the second Ga-rich region 220a, or within a range of 25.1% to 29% when forming the metastable well region having the AlN mole fraction of 25% in the second Ga-rich region 220a. The difference in AlN mole fraction between the metastable well region and the terrace region TA in the well layer 220 is set 4% or less to suppress the occurrence of double emission peaks due to the difference in AlN mole fraction between the inclined region IA and the terrace region TA. However, the AlN mole fraction of the terrace region TA in the well layer 220 can take any value within the range of approximately 25% to 54% according to the target value of the peak emission wavelength, even if it is out of the above four preferred ranges, as long as the second Ga-rich region 220a having a locally lower AlN mole fraction can be formed in the inclined region IA of the well layer 220.

The AlN mole fraction in the fourth Ga-rich region 221a of the barrier layer 221 is adjusted within the range of 58.3% to 100% according to the target value of the peak emission wavelength of the light-emitting element 1, as described above, with the AlN mole fraction in the second Ga-rich region 220a of the well layer 220 and the film thickness of the well layer 220 being adjusted. Furthermore, as a preferred implementation, in the case of the barrier layer 221 composed of the AlGaN-based semiconductor (excluding the AlN-based semiconductor), a metastable barrier region composed of a metastable AlGaN in which an AlGaN composition ratio is an integer ratio of $Al_5Ga_1N_6$, $Al_3Ga_1N_4$, $Al_2Ga_1N_3$, or $Al_7Ga_5N_{12}$, that is the AlN mole fraction is 83.3% (⅚), 75% (¾), 66.7% (⅔), or 58.3% (7/12), is formed in the fourth Ga-rich region 221a of the barrier layer 221.

Furthermore, in the case of the barrier layer 221 composed of the AlGaN-based semiconductor (excluding the AlN-based semiconductor), the AlN mole fraction in the terrace region TA of the barrier layer 221 is set higher than the AlN mole fraction of the fourth Ga-rich region 221a by 1% or more, preferably 2% or more, even preferably 4% or more within a range of about 60% to 90%. It is preferable that the difference in AlN mole fraction between the fourth Ga-rich region 221a and the terrace region TA in the barrier layer 221 is 4% to 5% or more in order to sufficiently ensure the effect of carrier localization in the fourth Ga-rich region 221a, but the carrier localization can be expected even if the difference in AlN mole fraction is about 1% to 2%.

In the case where the metastable barrier region with the above AlGaN composition ratio is formed in the fourth Ga-rich region 221a of the barrier layer 221, it is preferable that the AlN mole fraction of the terrace region TA in the barrier layer 221 is adjusted within a range of 85% to 90% when the AlN mole fraction of the metastable barrier region is 83.3%, within a range of 77% to 82% when the AlN mole fraction of the metastable barrier region is 75%, within a range of 69% to 74% when the AlN mole fraction of the metastable barrier region is 66.7%, or within a range of 60% to 66% when the AlN mole fraction of the metastable barrier region is 58.3%. This ensures that the AlN mole fraction difference between the fourth Ga-rich region 221a and the terrace region TA in the barrier layer 221 is about 2% or more. However, the AlN mole fraction of the terrace region TA in the barrier layer 221 can take any value within the range of approximately 59% to 90%, depending on the AlN mole fraction in the second Ga-rich region 220a of the well layer 220, even if it is out of the above four preferred ranges, as long as the fourth Ga-rich region 221a capable of localizing carriers is formed in the inclined region IA of the barrier layer 221.

The AlN mole fraction in the terrace region TA of the electron blocking layer 23 is set higher than the AlN mole fraction of the terrace region of the well layer 220 by 20% or more, preferably 25% or more, even preferably 30% or more within a range of about 69% to 90%. Furthermore, the AlN mole fraction in the first Ga-rich region 23a of the electron blocking layer 23 is set higher than the AlN mole fraction of the second Ga-rich region 220a of the well layer 220 by 20% or more, preferably 25% or more, even preferably 30% or more.

As one preferred implementation, the first metastable p-type region composed of the p-type metastable AlGaN in which the AlN mole fraction is higher than that of the metastable well region by 20% or more and the AlGaN composition ratio is an integer ratio of $Al_5Ga_1N_6$ (AlN mole fraction: $5/6=83.3\%$), $Al_3Ga_1N_4$ (AlN mole fraction: $3/4=75\%$), or $Al_2Ga_1N_3$ (AlN mole fraction: $2/3=66.7\%$) is dominantly present in the first Ga-rich region 23a of the electron blocking layer 23 in the same way that the metastable well region in which the AlGaN composition ratio is an integer ratio of $Al_1Ga_1N_2$, $Al_5Ga_7N_{12}$, $Al_1Ga_2N_3$, or $Al_1Ga_3N_4$ is dominantly present in the second Ga-rich region 220a of the well layer 220 according to the target value of the peak emission wavelength.

All combinations of the AlGaN composition ratio of the metastable well region and the AlGaN composition ratio of the first metastable p-type region except one combination, in which the AlGaN composition ratio of the metastable well region is $Al_1Ga_1N_2$ and the AlGaN composition ratio of the first metastable p-type region is $Al_2Ga_1N_3$, are possible combinations that satisfy the above condition (the difference in the AlN mole fraction is 20% or more between the first Ga-rich region 23a and the second Ga-rich region 220a).

The AlN mole fraction in the terrace region TA of the electron blocking layer 23 is set higher than the AlN mole fraction of the first Ga-rich region 23a by 1% or more, preferably 2% or more, even preferably 4% or more within a range of about 69% to 90%. It is preferable that the difference in AlN mole fraction between the first Ga-rich region 23a and the terrace region TA in the electron blocking layer 23 is 4% to 5% or more in order to sufficiently ensure the effect of carrier localization in the first Ga-rich region 23a, but the carrier localization can be expected even if the difference in AlN mole fraction is about 1% to 2%.

As one preferred implementation, it is preferable that the AlN mole fraction of the terrace region TA in the electron blocking layer 23 is adjusted within a range of 85% to 90% when the AlN mole fraction of the first metastable p-type region is 83.3%, within a range of 77% to 82% when the AlN mole fraction of the first metastable p-type region is 75%, or within a range of 69% to 74% when the AlN mole fraction of the first metastable p-type region is 66.7%. This ensures that the AlN mole fraction difference between the first Ga-rich region 23a and the terrace region TA in the electron blocking layer 23 is about 2% or more. However, the AlN mole fraction of the terrace region TA in the electron blocking layer 23 can take any value within the range of approximately 68% to 90%, depending on the AlN mole fraction in the second Ga-rich region 220a of the well layer 220, even if it is out of the above three preferred ranges, as long as the first Ga-rich region 23a capable of localizing carriers is formed in the inclined region IA of the electron blocking layer 23.

The AlN mole fraction of the stratiform region 21a in the n-type cladding layer 21 is set higher than the AlN mole fraction of the second Ga-rich region 220a of the well layer 220 by 8.3% or more, or preferably 16% or more.

As one preferred implementation, in the case where the metastable well region, in which the AlGaN composition ratio is an integer ratio of $Al_1Ga_1N_2$, $Al_5Ga_7N_{12}$, $Al_1Ga_2N_3$, or $Al_1Ga_3N_4$, is dominantly present in the second Ga-rich region 220a of the well layer 220 and where the metastable n-type region, in which the AlGaN composition ratio is an integer ratio of $Al_3Ga_1N_4$, $Al_2Ga_1N_3$, $Al_7Ga_5N_{12}$, or $Al_1Ga_1N_2$, is dominantly present in the stratiform region 21a of the n-type cladding layer 21, all combinations of the AlGaN composition ratio of the metastable well region and the AlGaN composition ratio of the metastable n-type region except one combination, in which the AlGaN composition ratios of the metastable well region and the metastable n-type region are both $Al_1Ga_1N_2$, are possible combinations that satisfy the above condition (the difference in the AlN mole fraction is 8.3% or more between the stratiform region 21a and the second Ga-rich region 220a).

Figure 10:
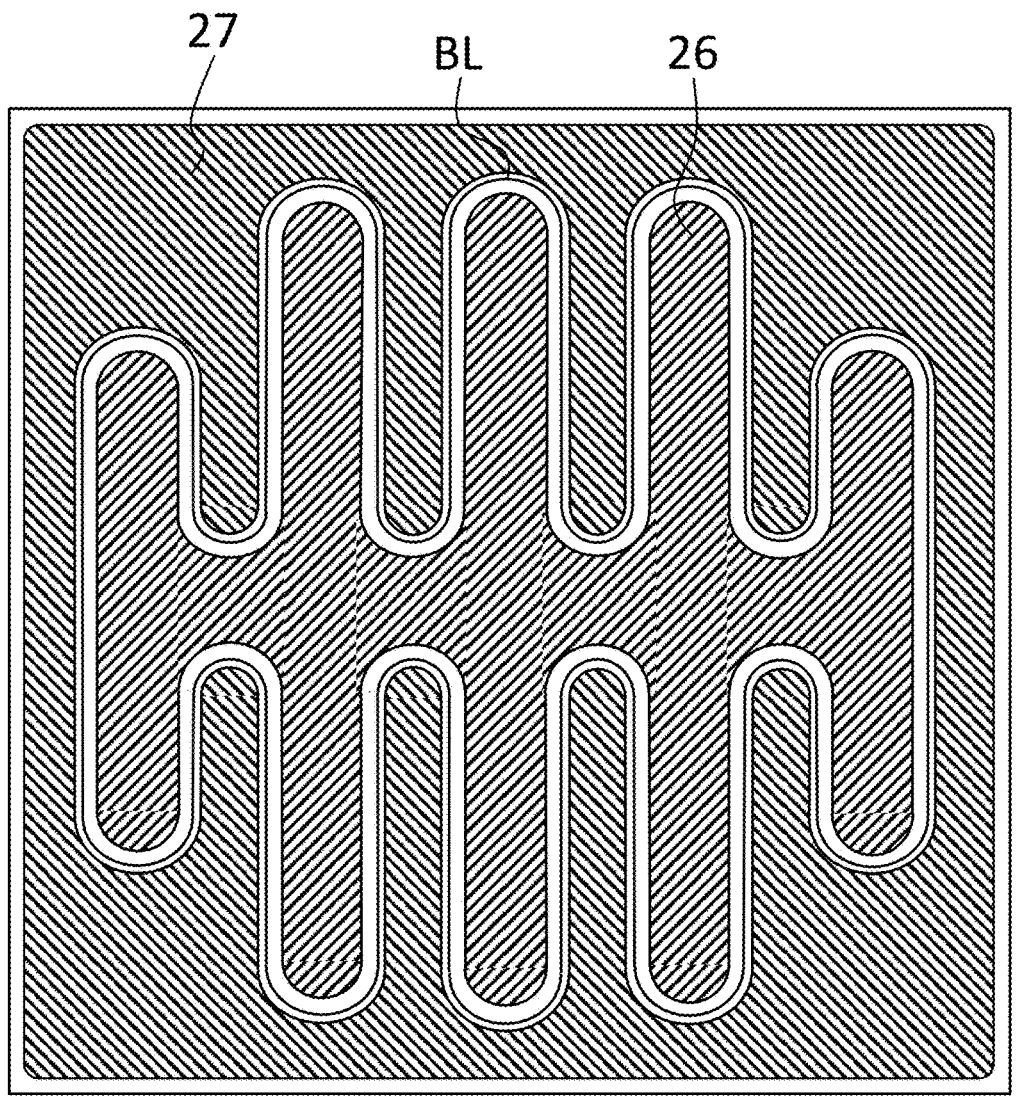
FIG. 10 is a plan view schematically showing an exemplary structure when the nitride semiconductor ultraviolet light-emitting element shown in FIG. 4 is viewed from the upper side of FIG. 4.

The p-electrode 26 is made of, for example, a multilayer metal film such as Ni/Au, and is formed on the upper surface of the p-type contact layer 24. The n-electrode 27 is made of, for example, a multilayer metal film such as Ti/Al/Ti/Au and is formed on a part of the exposed surface of the n-type cladding layer 21 in second region R2. The p-electrode 26 and the n-electrode 27 are not limited to the multilayer metal film described above, and the electrode structure such as the metal constituting each electrode, the number of layers, and the stacking order of layers may be changed as appropriate. FIG. 10 shows an example of shapes of the p-electrode 26 and the n-electrode 27 viewed from the upper side of the light-emitting elements 1. In FIG. 10, a line BL existing between the p-electrode 26 and the n-electrode 27 represents a boundary line between the first region R1 and the second region R2 and coincides with the outer peripheral side wall surfaces of the active layer 22, the electron blocking layer 23, and the p-type contact layer 24.

Although in the present embodiment, as shown in FIG. 10, a comb-like shape is employed as an example of the planarly-viewed shapes of the first region R1 and the p-electrode 26, the planarly-viewed shapes and arrangements of the first region R1 and the p-electrode 26 are not limited to the illustration shown in FIG. 10.

When a forward bias is applied between the p-electrode and the n-electrode, holes are supplied from the p-electrode 26 toward the active layer 22, electrons are supplied from the n-electrode 27 toward the active layer 22, and the supplied holes and electrons respectively reach the active layer 22 and recombine to emit light. This also causes a forward current to flow between the p-electrode 26 and the n-electrode 27.

The light-emitting element 1 of the present embodiment described in detail above is characterized in that the electron blocking layer 23 has a surface on which multi-step terraces parallel to the (0001) plane originating from the main surface 11a of the sapphire substrate 11 are formed, the inclined region IA inclined with respect to the (0001) plane is formed between the terraces T adjacent in the lateral direction in the electron blocking layer 23, and the first Ga-rich region 23a having an AlN mole fraction lower than that of the terrace region TA is formed in the inclined region IA.

Figure 11:
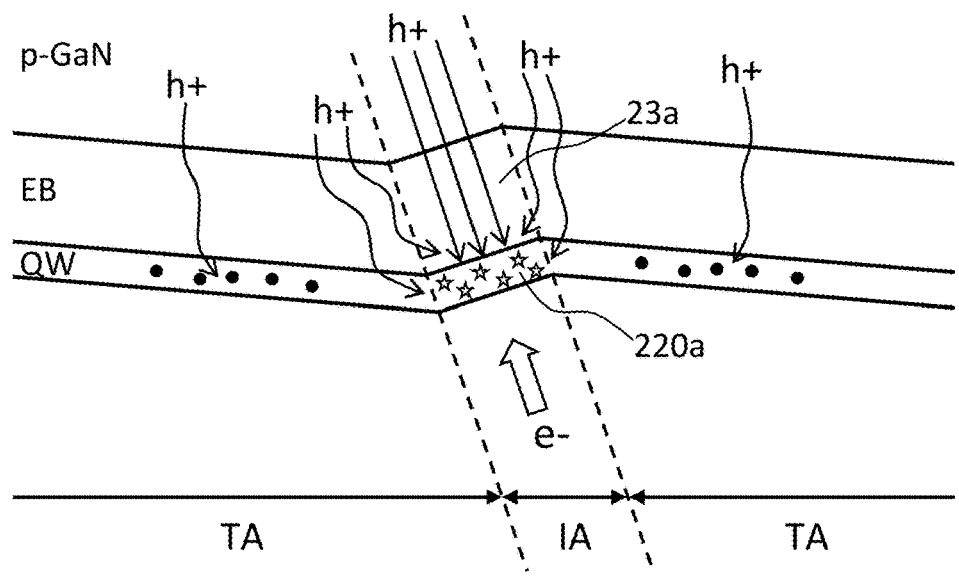
FIG. 11 is a diagram schematically explaining the behavior of carriers in the well layer and the electron blocking layer of the nitride semiconductor ultraviolet light-emitting element according to the first embodiment.
Figure 17:
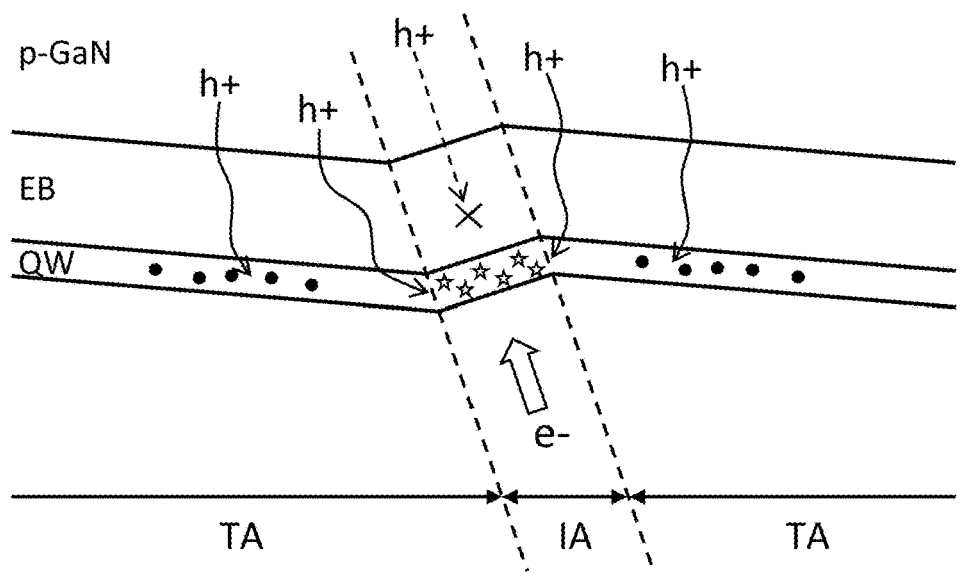
FIG. 17 is a diagram schematically explaining the behavior of carriers in the well layer and the electron blocking layer of the conventional nitride semiconductor ultraviolet light-emitting element.

According to the above-described feature, since localization of carriers (holes) can occur within the first Ga-rich region 23a, holes (h+) injected into the electron blocking layer 23 can also be injected directly into the inclined regions IA, as schematically illustrated in FIG. 11. Then, the amount of holes that are directly injected into the inclined regions IA of the electron blocking layer 23 and reach the inclined regions IA of the well layer 220 (QW), which are the localized centers of radiative recombination (indicated by ☆ (asterisk) in the figure), without diffusing within the terrace regions TA is greatly increased. As a result, it is possible to suppress the decrease in internal quantum efficiency and the occurrence of double emission peaks, which have been problems in the conventional nitride semiconductor ultraviolet light-emitting element. • (solid circle) shown in FIG. 11 indicates non-radiative recombination center as in FIG. 17.

<Method for Manufacturing Light-Emitting Element>

Next, an example of a manufacturing method of the light-emitting element 1 illustrated in FIG. 4 will be described.

First, by a well-known epitaxial growth method such as metalorganic vapor phase epitaxy (MOVPE) method, the AlN layer 12 contained in underlying part 10 and the nitride semiconductor layers 21 to 24 contained in the light-emitting element structure part 20 are epitaxially grown on the sapphire substrate 11 sequentially and laminated. At this time, for example, Si is doped into the n-type cladding layer 21 as a donor impurity and Mg is doped into the electron blocking layer 23, and the p-type contact layer 24 as an acceptor impurity.

In the present embodiment, in order to make multi-step terraces parallel to the (0001) plane on at least the AlN layers 12, the n-type cladding layer 21, the active layer 22 (the well layer 220, the barrier layer 221), and the electron blocking layer 23, a slightly inclined substrate is used as the sapphire substrate 11, in which the main surface 11a is inclined at an angle (miscut angle) within a certain range (for example, from 0 degree to about 6 degrees) with respect to the (0001) plane, and the multi-step terraces appear on the main surface 11a.

As a condition of such epitaxial growth, in addition to the use of the slightly inclined (0001) sapphire substrate 11, for example, growth rate in which the multi-step terraces easily appear (specifically, for example, the growth rate achieved by appropriately setting various conditions such as growth temperature, supply amount and flow rate of the source gases and the carrier gas) and the like are included. Note that these various conditions may differ depending on the type and structure of the film forming apparatus, and therefore, it is good to actually make some samples in the film forming apparatus in order to specify these conditions.

As growth conditions of the n-type cladding layer 21, a growth temperature, a growth pressure, and a donor impurity concentration are selected so that the growth start points of the stratiform region 21a are formed on the step portions (inclined region) between the multi-step terraces formed on the upper surface of the AlN layer 12 by the mass-transfer of Ga immediately after the growth start, and the stratiform region 21a can grow obliquely upward by the segregation due to the mass-transfer of Ga in accordance with the epitaxial growth of the n-type cladding layer 21.

Specifically, the growth temperature is preferably 1050° C. or higher at which the mass-transfer of Ga easily occurs, and the growth temperature is preferably 1150° C. or lower at which a good n-type AlGaN can be prepared. Furthermore, the growth temperature exceeding 1170° C. is not preferable since the mass-transfer of Ga becomes excessive, and the AlN mole fraction tends to vary randomly even in the first metastable AlGaN, and it becomes difficult to form stably the metastable n-type region that is the n-type metastable AlGaN with the AlN mole fraction of 50% to 75%. The growth pressure of 75 Torr or less is preferable as the growth condition of a good AlGaN, and the growth pressure of 10 Torr or more is practical as the control limit of the film forming apparatus. The donor impurity density is preferably about $1\times10^{18}$ to $5\times10^{18}$ cm$^{-3}$. The above-mentioned growth temperature, growth pressure, and the like are examples, and the optimum conditions may be appropriately specified according to the film forming apparatus to be used.

The supply amount and the flow rate of the source gases (trimethylaluminum (TMA) gas, trimethylgallium (TMG) gas, and ammonia gas) and the carrier gas used in the metalorganic vapor phase epitaxy method are set according to the average AlN mole fraction Xna of the entire n-type cladding layer 21 as a target value. Here, assuming that the average AlN mole fraction of the n-type body region 21b is Xn1, the AlN mole fraction of the metastable n-type region is Xn2 (Xn1>Xn2), and the average AlN mole fraction of the stratiform region 21a, in which the metastable n-type region and a region having an AlN mole fraction intermediate between the respective AlN mole fractions of the metastable n-type region and the n-type body region are present, is Xn3 (Xn1>Xn3>Xn2), and considering the mass-transfer of Ga from the n-type body region 21b to the stratiform region 21a, Xn1>Xna>X n3. However, since the volume ratio of the stratiform region 21a to the entire n-type cladding layer 21 is small, it can be approximately set as Xna=Xn1.

The relationship between the AlN mole fraction Xn1 (=Xna) of the n-type body region 21b and the AlN mole fraction Xn2 of the metastable n-type region is summarized below.

Xn2=75%: 77%≤Xn1≤82%
Xn2=66.7%: 69%≤Xn1≤74%
Xn2=58.3%: 60%≤Xn1≤66%
Xn2=50%: 52%≤Xn1≤57%

In the stratiform region 21a, since the metastable n-type region having the AlN mole fraction Xn2 is stably present and the difference between the AlN mole fraction Xn2 in the metastable n-type region and the average AlN mole fraction Xn1 of the n-type body region 21b (Xn1-Xn2) is stably ensured to be about 2% or more, as described above, the carriers in the n-type layer are localized in the stratiform region 21a having a smaller bandgap energy than the n-type body region 21b. If the target value Xna (=Xn1) is increased, for example, by 1% from the lower limit of the preferred range described above, the difference becomes 3% or more, and the localization of carriers in the n-type layer to the stratiform region 21a becomes more pronounced. Furthermore, since the upper limit of the above preferred range of the target value Xna corresponding the desired AlN mole fraction Xn2 of the metastable n-type region is set to be 1% or more lower than the desired AlN mole fraction of the metastable n-type region in which the AlN mole fraction is higher than the desired AlN mole fraction Xn2 by one step, dominant formation of a metastable n-type region whose AlGaN composition ratio is one step higher is avoided in the n-type cladding layer 21.

Note that the donor impurity concentration does not necessarily have to be uniformly controlled in the vertical direction with respect to the film thickness of the n-type cladding layer 21. For example, there may be a low impurity concentration layer in which the impurity concentration of a predetermined thin film thickness portion in the n-type cladding layer 21 is lower than the above-mentioned set concentration, and is controlled to be, for example, less than $1\times10^{18}$ cm$^{-3}$, more preferably $1\times10^{17}$ cm$^{-3}$ or less. As the film thickness of the low impurity concentration layer, it is preferably about larger than 0 nm and 200 nm or less, more preferably about 10 nm or more and 100 nm or less, and still more preferably about 20 nm or more and 50 nm or less. Furthermore, the donor impurity concentration of the low impurity concentration layer may be lower than the set concentration, and an undoped layer (0 cm$^{-3}$) may be partially included. Furthermore, it is preferable that a part of or all the low-impurity-concentration layer is present in the upper layer region having a depth of 100 nm or less at lower side from the upper surface of the n-type cladding layer 21.

As described above, when the n-type cladding layer 21 having the stratiform region 21a and the n-type body region 21b is formed, the active layer 22 (the well layer 220, the barrier layer 221), the electron blocking layer 23, the p-type contact layer 24, and the like are subsequently formed on the entire upper surface of the n-type cladding layer 21 by a well-known epitaxial growth method such as a metalorganic vapor phase epitaxy (MOVPE) method.

The acceptor impurity concentration of the electron blocking layer 23 is, for example, preferably about $1.0 \times 10^{16}$ to $1.0 \times 10^{18}$ cm$^{-3}$, and the acceptor impurity concentration of the p-type contact layer 24 is, for example, $1.0 \times 10^{18}$ to $1.0 \times 10^{20}$ cm$^{-3}$. Note that the acceptor impurity concentration does not necessarily have to be uniformly controlled in the vertical direction with respect to the film thicknesses of the electron blocking layer 23 and the p-type contact layer 24.

In forming the active layer 22, under the growth conditions in which the above-mentioned multi-step terraces easily appear in the same manner as in the n-type cladding layer 21, by setting the AlN mole fraction Xw1 set for the terrace region TA of the well layer 220 approximately as an average AlN mole fraction Xwa of the entire well layer 220, the well layer 220 is grown using the AlN mole fraction Xwa as a target value. Furthermore, by setting the AlN mole fraction Xb1 set for the terrace region TA of the barrier layer 221 approximately as an average AlN mole fraction Xba of the entire barrier layer 221, the barrier layer 221 is grown using the AlN mole fraction Xba as a target value.

The relationship between the AlN mole fraction Xw1 (=Xwa) of the terrace region TA of the well layer 220 and the AlN mole fraction Xw2 of the metastable well region is summarized below.

Xw2=50%: 50.1%≤Xw1≤54%
Xw2=41.7%: 41.8%≤Xw1≤45%
Xw2=33.3%: 33.4%≤Xw1≤37%
Xw2=25%: 25.1%≤Xw1≤29%

Furthermore, the relationship between the AlN mole fraction Xb1 (=Xba) of the terrace region TA of the barrier layer 221 and the AlN mole fraction Xb2 of the metastable barrier region is summarized below.

Xb2=83.3%: 85%≤Xb1≤90%
Xb2=75%: 77%≤Xb1≤82%
Xb2=66.7%: 69%≤Xb1≤74%
Xb2=58.3%: 60%≤Xb1≤66%

In forming the electron blocking layer 23, under the growth conditions in which the above-mentioned multi-step terraces easily appear in the same manner as in the n-type cladding layer 21, by setting the AlN mole fraction Xe1 set for the terrace region TA of the electron blocking layer 23 approximately as an average AlN mole fraction Xea of the entire electron blocking layer 23, the electron blocking layer 23 is grown using the AlN mole fraction Xea as a target value.

The relationship between the AlN mole fraction Xe1 (=Xea) of the terrace region TA of the electron blocking layer 23 and the AlN mole fraction Xe2 of the first metastable p-type region is summarized below.

Xe2=83.3%: 85%≤Xe1≤90%
Xe2=75%: 77%≤Xe1≤82%
Xe2=66.7%: 69%≤Xe1≤74%

In the present embodiment, assuming that the growth temperature of the n-type cladding layer 21 is T1, the growth temperature of the active layer 22 is T2, the growth temperature of the electron blocking layer 23 is T3, and the growth temperature of the p-type contact layer 24 is T4, it is preferable that the growth temperatures of the active layer 22 (the well layer 220, the barrier layer 221), the electron blocking layer 23, the p-type contact layer 24 satisfy the relationships shown in the following formulas (1) and (2) within the preferred temperature range (1050° C. to 1170° C.) as described above.

$$T3 \geq T2 \quad (1)$$

$$T3 > T1 > T4 \quad (2)$$

Furthermore, the relationship shown in the above formula (1) is preferably the following formula (1A) when the AlN mole fraction of the first metastable p-type region in the first Ga-rich region 23a of the electron blocking layer 23 is 83.3% or 75%, and preferably the following formula (1B) when the AlN mole fraction of the first metastable p-type region is 66.7%. This is because a higher AlN mole fraction in the first metastable p-type region requires a higher growth temperature to promote mass-transfer of Ga.

$$T3 \geq T2 + 50° \text{ C.} \quad (1A)$$

$$T2 + 50° \text{ C.} > T3 \geq T2 \quad (1B)$$

Furthermore, the growth temperature T3 of the electron blocking layer 23 is preferably 1150° C. or higher when the AlN mole fraction of the first metastable p-type region is 83.3% and is preferably 1100° C. or higher and even preferably higher than 1100° C. when the AlN mole fraction of the first metastable p-type region is 75% or 66.7%. However, the above temperatures are only examples. For example, by increasing the flow rate of the nitrogen source gas and decreasing the growth rate, the above 1150° C. and 1100° C. can be reduced to 1100° C. and 1050° C., respectively.

When the growth temperature T3 of the electron blocking layer 23 is raised from the growth temperature T2 of the active layer 22, the decomposition of GaN occurs in the well layer 220 located below the electron blocking layer 23 during the transition process of the growth temperature. As a result, the characteristics of the light-emitting element 1 may deteriorate. Therefore, in order to suppress the decomposition of GaN, it is preferable to form an AlGaN or AlN layer, which has a film thickness less than the barrier layer 221 (for example, 3 nm or less, preferably 2 nm or less) and a higher AlN mole fraction than the barrier layer 221 and the electron blocking layer 23, between the uppermost well layer 220 and the electron blocking layer 23.

As an example of growth conditions other than the growth temperature for promoting the mass transfer of Ga in the electron blocking layer 23, the flow ratio (V/III) of the source gases is preferably 5000 to 6000, and the growth rate is preferably about 150 nm/h when the growth temperature T3 is 1150° C.

Examples of the growth temperatures T1 to T4 of the n-type cladding layer 21, the active layer 22 (the well layer 220, the barrier layer 221), the electron blocking layer 23, and the p-type contact layer 24 satisfying the above formulas (1A) and (2) are shown below.

T1=T2=1080° C., T3=1150° C., T4=980° C.

The above examples of the growth temperatures T1 to T4 can be applied to the AlN mole fraction Xn2 of the metastable n-type region in the stratiform region 21a of the n-type cladding layer 21, the AlN mole fraction Xw2 of the metastable well region in the second Ga-rich region 220a of the well layer 220, the AlN mole fraction Xb2 in the metastable barrier region in the fourth Ga-rich region 221*a* of the barrier layer 221, and the AlN mole fraction Xe2 of the first metastable p-type region in the first Ga-rich region 23*a* of the electron blocking layer 23, which are described below.

Xn2=50%, 58.3%, 66.7%, 75%
Xw2=25%, 33.3%, 41.7%, 50%
Xb2=58.3%, 66.7%, 75%, 83.3%
Xe2=66.7%, 75%, 83.3%

After the active layer 22 (the well layer 220, the barrier layer 221), the electron blocking layer 23, the p-type contact layer 24, and the like are formed on the entire upper surface of the n-type cladding layer 21 in the manner described above, the second region R2 of the nitride semiconductor layers 21 to 24 is selectively etched until the upper surface of the n-type cladding layer 21 is exposed by a well-known etching method such as reactive ion etching. As a result, the second region R2 part of the upper surface of the n-type cladding layer 21 is exposed. Then, the p-electrode 26 is formed on the p-type contact layer 24 in the unetched first region R1 and the n-electrode 27 is formed on the n-type cladding layer 21 in the etched second region R2 by a well-known deposition method such as an electron-beam evaporation method. After at least one of the p-electrode 26 and the n-electrode 27 is formed, heat treatment may be performed by a well-known heat treatment method such as RTA (rapid thermal annealing).

Note that, as an example, the light-emitting element 1 can be used in a state in which it is flip-chip mounted on a base such as a submount and then sealed by a predetermined resin such as a silicone resin or an amorphous fluororesin (e.g., a resin having a lens shape)

The cross-sectional structure of the AlGaN-based semiconductor layers 21 to 24 of the light-emitting element 1 manufactured in the above manner can be observed by an HAADF-STEM image of a sample piece having a cross section perpendicular (or substantially perpendicular) to the upper surface of a sample. The sample peace is prepared by processing the sample, which is obtained before etching the second region R2 and forming the p-electrode 26 and the n-electrode 27, with a focused ion beam (FIB).

Furthermore, the compositional analysis in specific semiconductor layers among the AlGaN-based semiconductor layers 21 to 24 is performed by energy dispersive X-ray spectroscopy (cross-sectional TEM-EDX) or CL (cathodoluminescence) method using the above sample piece. Although the compositional analysis by the cross-sectional TEM-EDX and the CL method is not described, the detailed description is available in the specification of other prior applications filed by the present inventors (PCT/JP2020/023050, PCT/JP2020/024828, PCT/JP2020/026558, and PCT/JP2020/031620).

Second Embodiment

In the light-emitting element 1 of the first embodiment, the p-type layer constituting the light-emitting element structure part 20 is composed of two layers, the electron blocking layer 23 and the p-type contact layer 24, but in the light-emitting element 2 of the second embodiment, the p-type layer has a p-type cladding layer 25 composed of one or more p-type AlGaN semiconductors between the electron blocking layer 23 and the p-type contact layer 24.

Figure 12:
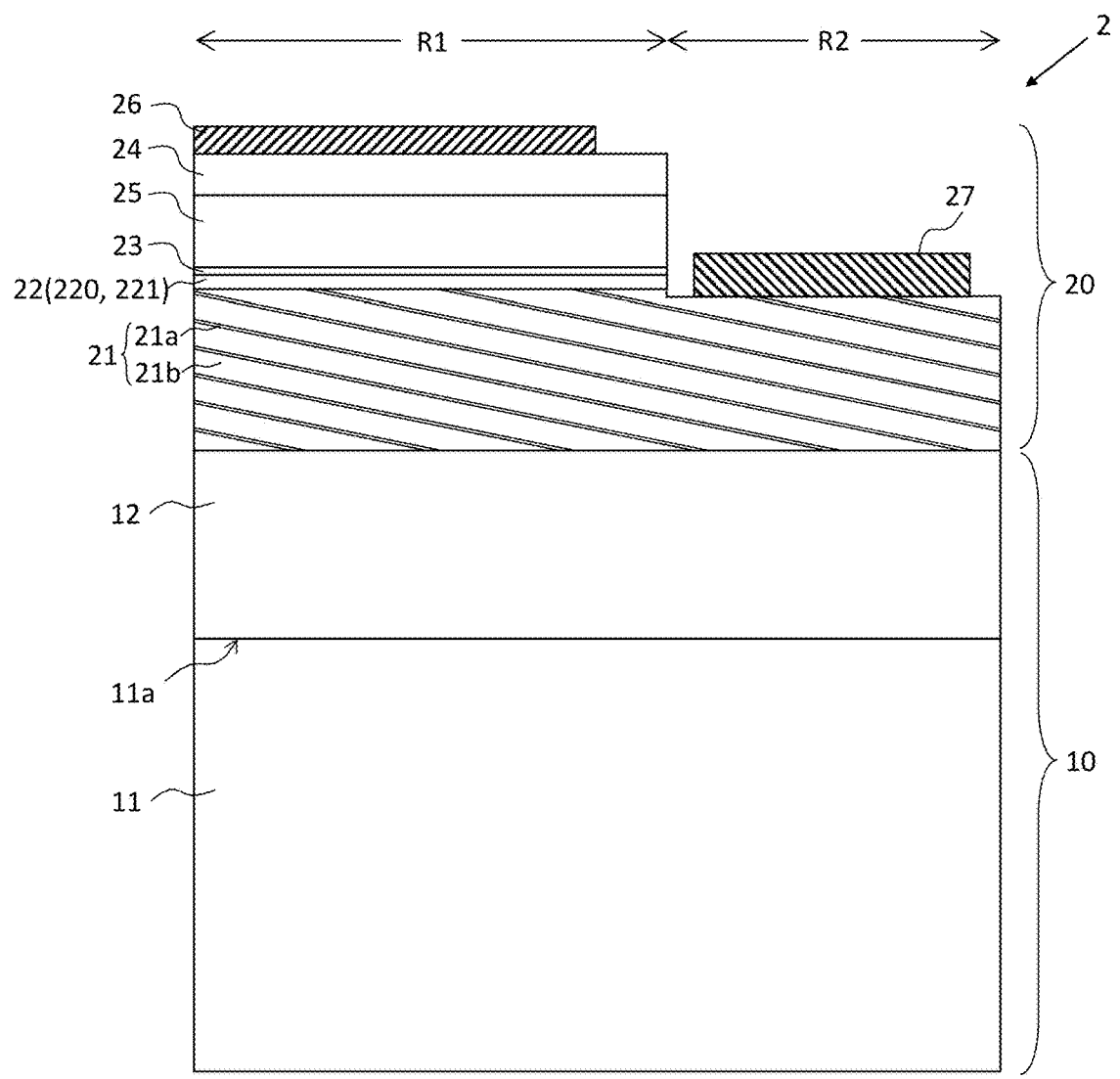
FIG. 12 is a fragmentary cross-sectional view schematically showing an exemplary configuration of a nitride semiconductor ultraviolet light-emitting element according to the second embodiment of the present invention.

Therefore, in the second embodiment, as shown FIG. 12, the AlGaN-based semiconductor layers 21-25 of the light-emitting element structure part 20 comprises a structure having the n-type cladding layer 21 (n-type layer), the active layer 22, the electron blocking layer 23 (p-type layer), the p-type cladding layer 25 (p-type layer), and the p-type contact layer 24 (p-type layer) stacked in order from the underlying part 10 side by epitaxially growing them in order.

The underlying part 10 and the AlGaN-based semiconductor layers 21-24, the p-electrode 26 and the n-electrode 27 of the light-emitting element structure part 20 in the light-emitting element 2 of the second embodiment are the same as the underlying part 10 and the AlGaN-based semiconductor layers 21-24, the p-electrode 26 and the n-electrode 27 of the light-emitting element structure part 20 in the light-emitting element 1 of the first embodiment, so redundant description will be omitted.

The p-type cladding layer 25 has a surface on which multi-step terraces parallel to the (0001) plane originating from the main surface 11*a* of the sapphire substrate 11 are formed as well as the AlN layer 12 of the underlying part 10, and the n-type cladding layer 21, each semiconductor layer within the active layer 22, and the electron blocking layer 23 of the light-emitting element structure part 20, which are epitaxially grown in order from the main surface 11*a* of the sapphire substrate 11.

Figure 13:
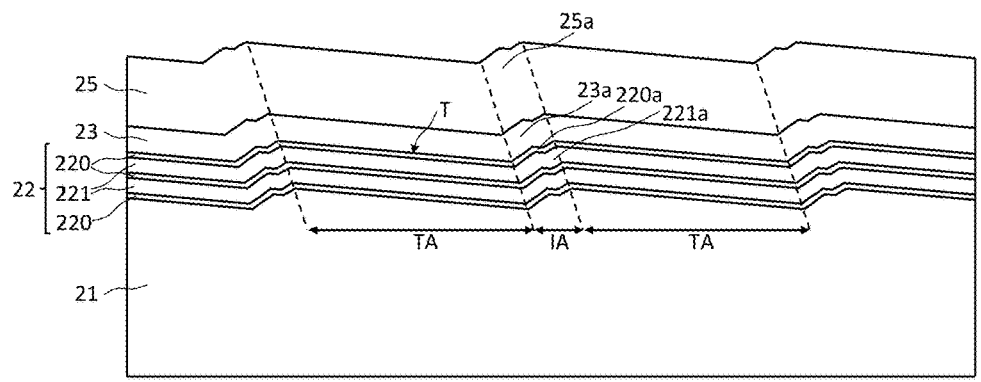
FIG. 13 is a fragmentary cross-sectional view schematically showing an exemplary laminated structure of the main part including an active layer of the nitride semiconductor ultraviolet light-emitting element shown in FIG. 12.

FIG. 13 schematically shows an exemplary laminated structure (multi-quantum-well structure) of the well layer 220 and the barrier layer 221 in the active layer 22. In FIG. 13, the p-type cladding layer 25 is formed on the electron blocking layer 23 in the laminated structure explained using FIG. 5 in the first embodiment.

In the p-type cladding layer 25, the inclined region IA inclined with respect to the (0001) plane is also formed between the terraces T adjacent in the lateral direction as described above. A region other than the inclined region IA, which is sandwiched vertically between the terraces T, is referred to as a terrace region TA. The film thickness of the p-type cladding layer 25 is set, for example, within a range of 20 nm to 200 nm including the terrace region TA and the inclined region IA.

As schematically shown in FIG. 13, in the p-type cladding layer 25, the third Ga-rich region 25*a* having a lower AlN mole fraction than the terrace region TA is formed in the inclined region IA due to the mass-transfer of Ga from the terrace region TA to the inclined region IA.

The AlN mole fraction of the terrace region TA in the p-type cladding layer 25 is set within a range of 52% or more and less than the AlN mole fraction of the terrace region TA in the electron blocking layer 23. Furthermore, the AlN mole fraction of the third Ga-rich region 25*a* in the p-type cladding layer 25 is set less than that of the first Ga-rich region 23*a* in the electron blocking layer 23.

Furthermore, the AlN mole fraction of the terrace region TA in the p-type cladding layer 25 is set to be higher than that of the third Ga-rich region 25*a* by 1% or more, preferably 2% or more, even preferably 4% or more within the above range. It is preferable that the difference in AlN mole fraction between the third Ga-rich region 25*a* and the terrace region TA in the p-type cladding layer 25 is 4% to 5% or more in order to sufficiently ensure the effect of carrier localization in the third Ga-rich region 25*a*, but the carrier localization can be expected even if the difference in AlN mole fraction is about 1% to 2%.

As one preferred implementation, the second metastable p-type region composed of the p-type metastable AlGaN in which the AlGaN composition ratio is an integer ratio of $Al_2Ga_1N_3$ (AlN mole fraction: $\frac{2}{3}$=66.7%), $Al_7Ga_5N_{12}$ (AlN mole fraction: $\frac{7}{12}$=58.3%), or $Al_1Ga_1N_2$ (AlN mole fraction: $\frac{1}{2}$=50%) and the AlN mole fraction is lower than that of the first metastable p-type region is dominantly present in the third Ga-rich region 25a of the p-type cladding layer 25 in the same way that the first metastable p-type region composed of the p-type metastable AlGaN in which the AlN mole fraction is higher than that of the metastable well region by 20% or more and the AlGaN composition ratio is an integer ratio of $Al_5Ga_1N_C$ (AlN mole fraction: $5/6=83.3\%$), $Al_3Ga_1N_4$ (AlN mole fraction: $3/4=75\%$), or $Al_2Ga_1N_3$ (AlN mole fraction: $2/3=66.7\%$) is dominantly present in the first Ga-rich region 23a of the electron blocking layer 23.

Furthermore, as one preferred implementation, it is preferable that the AlN mole fraction of the terrace region TA in the p-type cladding layer 25 is adjusted within a range of 69% to 74% when the AlN mole fraction of the second metastable p-type region is 66.7%, within a range of 60% to 66% when the AlN mole fraction of the second metastable p-type region is 58.3%, or within a range of 52% to 57% when the AlN mole fraction of the second metastable p-type region is 50%. This ensures that the AlN mole fraction difference between the third Ga-rich region 25a and the terrace region TA in the p-type cladding layer 25 is about 2% or more. However, the AlN mole fraction of the terrace region TA in the p-type cladding layer 25 can take any value within the range of approximately 51% to 75%, depending on the AlN mole fraction in the first Ga-rich region 23a of the electron blocking layer 23, even if it is out of the above three preferred ranges, as long as the third Ga-rich region 25a capable of localizing carriers is formed in the inclined region IA of the p-type cladding layer 25.

A method for growing the p-type cladding layer 25 will be briefly described. In the formation of the p-type cladding layer 25, the p-type cladding layer 25 is formed by setting the AlN mole fraction Xp1 set for the terrace region TA of the p-type cladding layer 25 approximately as the average AlN mole fraction Xpa of the entire p-type cladding layer 25 and using the AlN mole fraction Xpa as the target value under the growth conditions in which the above-described multi-step terraces easily appear, in the same manner as in the n-type cladding layer 21 and the electron blocking layer 23 described in the first embodiment.

The relationship between the AlN mole fraction Xp1 (=Xpa) of the terrace region TA of the p-type cladding layer 25 and the AlN mole fraction Xp2 of the second metastable p-type region is summarized below.

Xp2=66.7%: 69%≤Xp1≤74%
Xp2=58.3%: 60%≤Xp1≤66%
Xp2=50%: 52%≤Xp1≤57%

In the second embodiment, assuming that the growth temperature of the p-type cladding layer 25 is T5, it is preferable that the growth temperature T5 and the growth temperature T3 of the electron blocking layer 23 and the growth temperature T4 of the p-type contact layer 24 satisfy the relationships shown in the following formula (3), for example within a range of 1050° C. to 1170° C.

$$T3>T5>T4 \quad (3)$$

Furthermore, the growth temperature T5 of the p-type cladding layer 25 is preferably 1100° C. or higher when the AlN mole fraction of the second metastable p-type region is 66.7% and is preferably 1050° C. or higher when the AlN mole fraction of the second metastable p-type region is 58.3% or 50%.

As an example of growth conditions other than the growth temperature for promoting the mass transfer of Ga in the p-type cladding layer 25, the flow ratio (V/III) of the source gases is preferably 1000 to 6000, and the growth rate is preferably about 100 nm/h when the growth temperature T5 is 1080° C.

Examples of the growth temperatures T1 to T5 of the n-type cladding layer 21, the active layer 22 (the well layer 220, the barrier layer 221), the electron blocking layer 23, the p-type contact layer 24, and the p-type cladding layer 25 satisfying the above formulas (1A), (2) and (3) are shown below.

T1=T2=1080° C., T3=1150° C., T4=980° C., T5=1080° C.

The above example of the growth temperature T5 can be applied to the AlN mole fraction Xp2 of the second metastable p-type region in the third Ga-rich region 25a of the p-type cladding layer 25, which is described below.

Xp2=50%, 58.3%, 66.7%

The acceptor impurity concentration of the p-type cladding layer 25 is, for example, preferably about $1.0\times10^{16}$ to $1.0\times10^{18}$ cm$^{-3}$. Note that the acceptor impurity concentration does not necessarily have to be uniformly controlled in the vertical direction with respect to the film thicknesses of the p-type cladding layer 25.

The light-emitting element 2 of the second embodiment described in detail above is characterized in that the electron blocking layer 23 and the p-type cladding layer 25 have a surface on which multi-step terraces parallel to the (0001) plane originating from the main surface 11a of the sapphire substrate 11 are formed, the inclined region IA inclined with respect to the (0001) plane is formed between the terraces T adjacent in the lateral direction in the electron blocking layer 23 and the p-type cladding layer 25, and the first Ga-rich region 23a having an AlN mole fraction lower than that of the terrace region TA is formed in the inclined region IA of the electron blocking layer 23, and the third Ga-rich region 25a having an AlN mole fraction lower than that of the terrace region TA is formed in the inclined region IA of the p-type cladding layer 25.

Figure 14:
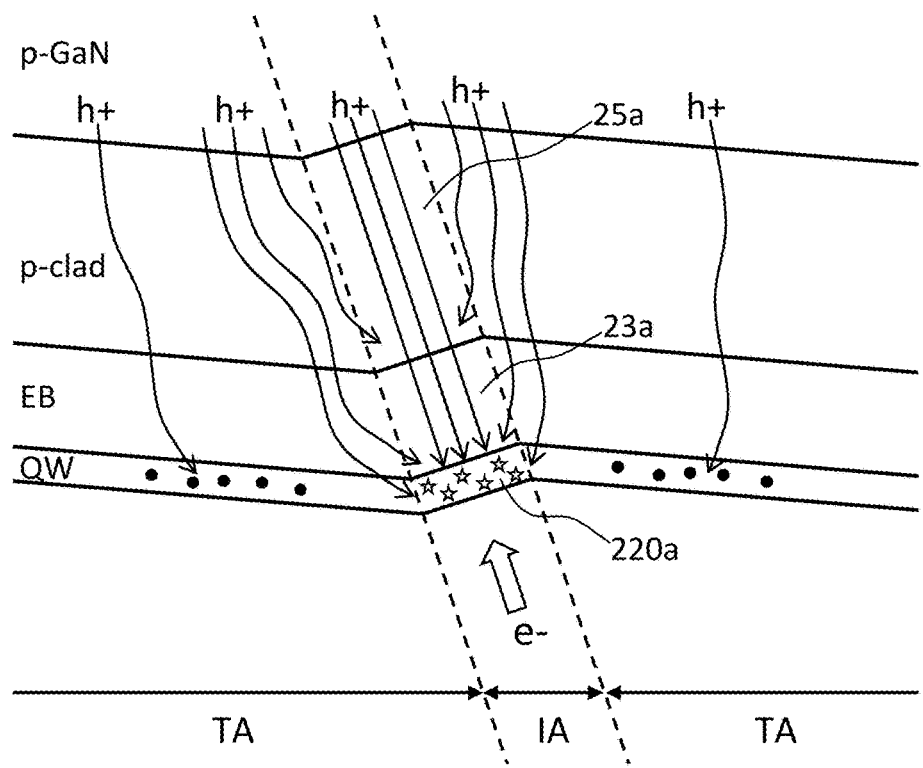
FIG. 14 is a diagram schematically explaining the behavior of carriers in the well layer, the electron blocking layer and the p-type cladding layer of the nitride semiconductor ultraviolet light-emitting element according to the second embodiment.
Figure 15:
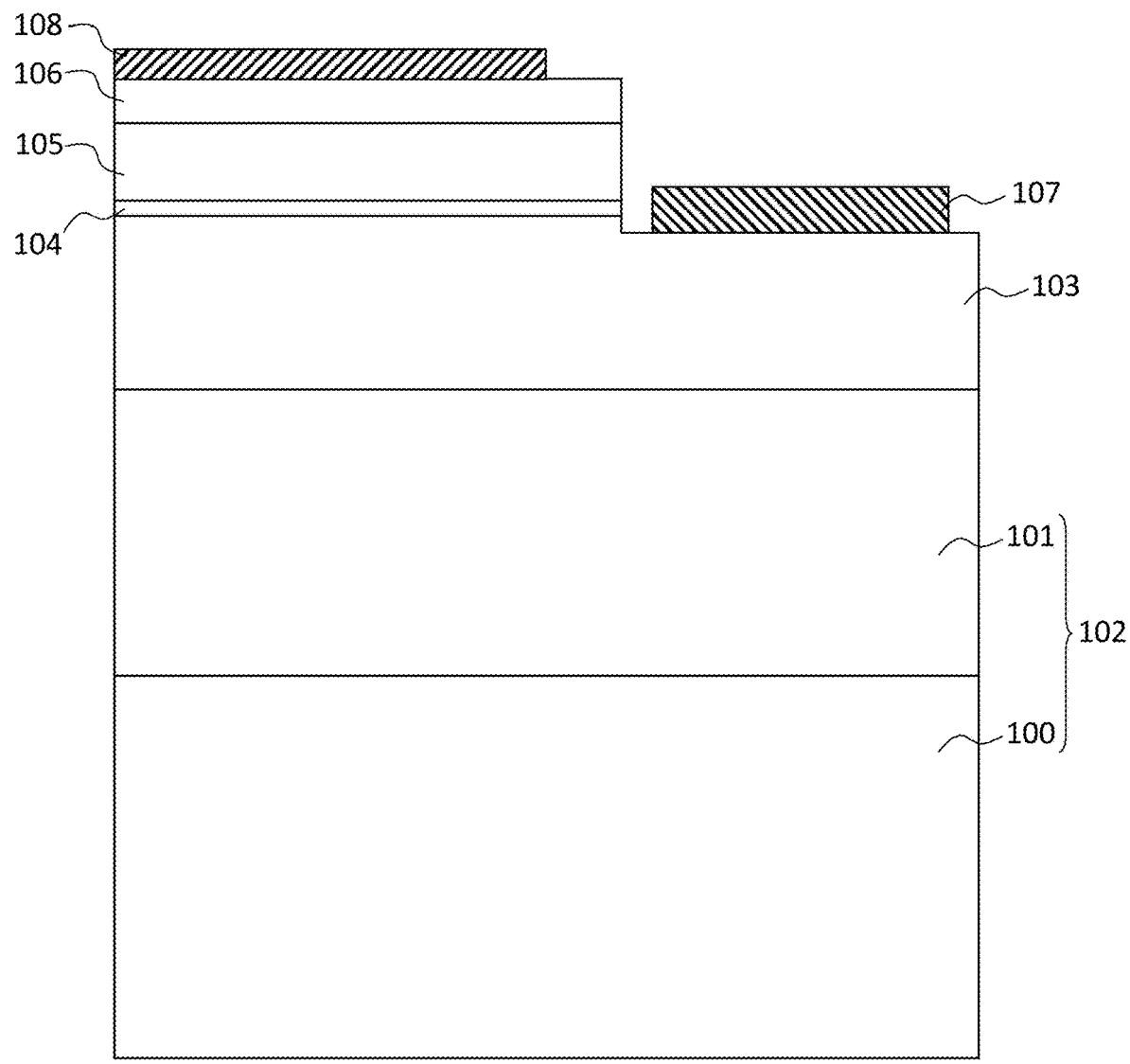
FIG. 15 is a fragmentary cross-sectional view schematically showing an example of an element structure of a general ultraviolet light-emitting diode.

According to the above-described feature, since localization of carriers (holes) can occur within the third Ga-rich region 25a, holes (h+) injected into the p-type cladding layer 25 can also be injected directly into the inclined regions IA or reach the inclined regions IA diffusing the terrace region Ta, as schematically illustrated in FIG. 14. Also, localization of carriers (holes) can also occur within the first Ga-rich region 23a, holes (h+) injected into the electron blocking layer 23 can also be injected directly into the inclined regions IA from the inclined regions IA of the p-type cladding layer 25. Therefore, some of the holes that are injected from the p-type contact layer 24 into the terrace region TA of the thin-film electron blocking layer 23 and reach the terrace region TA of the well layer 22 in the case of no p-type cladding layer 25 can be guided from the terrace region TA of the p-type cladding layer 25 into the inclined region IA and can reach the inclined region IA of the well layer 22 via the inclined region IA of the electron blocking layer 23. As a result, it is possible to suppress the decrease in internal quantum efficiency and the occurrence of double emission peaks. In FIG. 14, ☆ (asterisk) indicates the localized center of radiative recombination in the inclined region IA of the well layer 22, and • (solid circle) indicates non-radiative recombination center as in FIG. 11.

Other Embodiments

Modifications of the first and second embodiments will be described below.

(1) In the first and second embodiments, the electron blocking layer 23 is assumed to be formed under the same growth conditions for a predetermined film thickness, that is, the average composition (AlN mole fraction) in the second plane parallel to the upper surface of the electron blocking layer 23 is assumed to be uniform in the vertical direction. But the electron blocking layer 23 may be formed such that the average composition changes continuously or stepwise in the vertical direction. When the average composition changes stepwise in the vertical direction, the electron blocking layer 23 has a multilayer structure. It is preferable to change the AlN mole fraction of the average composition so that it increases toward the lower side (active layer 22 side).

(2) In the second embodiment, the p-type cladding layer 25 is assumed to be only one layer of the p-type cladding layer 25 formed under the same growth conditions for a predetermined film thickness, that is, the average composition (AlN mole fraction) in the second plane parallel to the upper surface of the p-type cladding layer 25 is assumed to be uniform in the vertical direction. But the p-type cladding layer 25 may be formed such that the average composition changes continuously or stepwise in the vertical direction. When the average composition changes stepwise in the vertical direction, the p-type cladding layer 25 has a multi-layer structure. It is preferable to change the AlN mole fraction of the average composition so that it increases toward the lower side (electron blocking layer 23 side).

(3) In the first and second embodiments, the active layer 22 was assumed to be composed of the multi-quantum-well structure in which the well layer 220 and the barrier layer 221 are stacked alternately where the well layer 220 includes two or more layers composed of an AlGaN-based semiconductor and the barrier layer 221 includes one or more layers composed of an AlGaN-based semiconductor or an AlN-based semiconductor. However, the active layer 22 may be configured with a single quantum-well structure having only one layer of the well layer 220, and it may be configured not to include the barrier layer 221 (quantum barrier layer). It is obvious that the advantages of the electron blocking layer 23 adopted in the above-described first and second embodiments and the advantages of the p-type cladding layer 25 adopted in the above-described second embodiment can be obtained in the same manner for such a single-quantum-well structure.

(4) In the above first and second embodiments, as an example of the growth condition of the n-type cladding layer 21, the supply amount and the flow rate of the source gases and the carrier gas used in the MOVPE method are set in accordance with the average AlN mole fraction of the entire n-type AlGaN layer constituting the n-type cladding layer 21. That is, when the average AlN mole fraction of the entire n-type cladding layer 21 is set uniformly in the vertical direction, it is assumed that the supply amount and the flow rate of the source gases and the like are controlled to be constant. However, the supply amount and the flow rate of the source gases and the like are not necessarily controlled to be constant.

(5) In the above first and second embodiments, the planarly-viewed shapes of the first region R1 and the p-electrode 26 are exemplarily a comb-like shape, but the planarly-viewed shapes are not limited to the comb-like shape. In addition, a plurality of the first regions R1 may be present, and each of them may be formed in a planarly-viewed shape surrounded by one second region R2.

(6) In the above first and second embodiments, the case using the underlying part 10, in which the sapphire substrate 11, in which the main surface has a miscut angle with respect to the (0001) surface, is used and the multi-step terraces appear on the surface of the AlN layer 12, is exemplified. However, the magnitude of the miscut angle and the direction in which the miscut angle is provided (specifically the direction in which the (0001) surface is inclined, for example, the m-axis direction, the a-axis direction, and the like) may be arbitrarily determined as long as the multi-step terraces appear on the surface of the AlN layer 12 and the growth start points of the stratiform region 21a are formed.

(7) In the above first and second embodiments, as illustrated in FIG. 1, the light-emitting element 1 having the underlying part 10 including the sapphire substrate 11 is illustrated as the light-emitting element 1, but the sapphire substrate 11 (or a part or all of layers included in the underlying part 10) may be removed by lift-off or the like. Furthermore, the substrate constituting the underlying part 10 is not limited to the sapphire substrate.

INDUSTRIAL APPLICABILITY

The present invention is available to a nitride semiconductor ultraviolet light-emitting element comprising a light-emitting element structure part with an n-type layer, an active layer, and a p-type layer stacked vertically which are made of AlGaN-based semiconductors with wurtzite structure.

DESCRIPTION OF SYMBOLS 1, 2 Nitride semiconductor ultraviolet light-emitting element
10 underlying part
11 sapphire substrate
11a main surface of sapphire substrate
12 AlN layer
15 light-emitting element structure part
21 n-type cladding layer (n-type layer)
21a stratiform region (n-type layer)
21b n-type body region (n-type layer)
22 active layer
220 well layer
220a second Ga-rich region
221 barrier layer
221a fourth Ga-rich region
23 electron blocking layer (p-type layer)
23a first Ga-rich region
24 p-type contact layer (p-type layer)
25 p-type cladding layer (p-type layer)
25a third Ga-rich region
26 p-electrode
27 n-electrode
100 substrate
101 AlGaN-based semiconductor layer
102 template
103 n-type AlGaN-based semiconductor layer
104 active layer
105 p-type AlGaN-based semiconductor layer
106 p-type contact layer
107 n-electrode
108 p-electrode
BL boundary line between first region and second region
IA inclined region
R1 first region
R2 second region
T terrace
TA terrace region

The invention claimed is:

1. A nitride semiconductor ultraviolet light-emitting element with a peak emission wavelength within a range of 250 nm to 310 nm comprising:

a light-emitting element structure part in which an n-type layer, an active layer, and a p-type layer made of an AlGaN-based semiconductor of wurtzite structure are stacked vertically, wherein the n-type layer is composed of an n-type AlGaN-based semiconductor, the active layer disposed between the n-type layer and the p-type layer has a quantum-well structure having one or more well layers composed of an AlGaN-based semiconductor, the p-type layer is composed of a p-type AlGaN-based semiconductor, each semiconductor layer in the n-type layer, the active layer and the p-type layer is an epitaxially grown layer having a surface on which multi-step terraces parallel to a (0001) plane are formed, the n-type layer has a plurality of stratiform regions uniformly distributed in the n-type layer with locally lower AlN mole fraction, each extending direction of the stratiform regions on a first plane perpendicular to an upper surface of the n-type layer has a portion inclined with respect to an intersection line between the upper surface of the n-type layer and the first plane, the p-type layer has an electron blocking layer as a lowermost layer of the p-type layer formed on an upper surface side of an uppermost layer of the one or more well layers, and a contact layer as an uppermost layer of the p-type layer composed of a p-type GaN-based semiconductor, each semiconductor layer in the active layer and the electron blocking layer have inclined regions inclined with respect to the (0001) plane connecting between adjacent terraces of the multi-step terraces, and terrace regions other than the inclined regions, respectively, an AlN mole fraction of the terrace regions in the electron blocking layer is 69% or more and 89% or less, and the inclined regions of the electron blocking layer include a first Ga-rich region in which an AlN mole fraction is locally lower than that of the terrace regions of the electron blocking layer, and the inclined regions of the well layer include a second Ga-rich region in which an AlN mole fraction is locally lower than that of the terrace regions in the well layer.

2. The nitride semiconductor ultraviolet light-emitting element according to claim 1, wherein the first Ga-rich region has a first metastable p-type region in which an AlGaN composition ratio is an integer ratio of $Al_5Ga_1N_6$ or $Al_3Ga_1N_4$ or $Al_2Ga_1N_3$.

3. The nitride semiconductor ultraviolet light-emitting element according to claim 2, wherein the second Ga-rich region in the well layer has a metastable well region composed of a metastable AlGaN in which an AlGaN composition ratio is an integer ratio of $Al_1Ga_1N_2$ or $Al_5Ga_7N_{12}$ or $Al_1Ga_2N_3$ or $Al_1Ga_3N_4$, when the first metastable p-type region in the first Ga-rich region is composed of a p-type metastable AlGaN in which an AlGaN composition ratio is an integer ratio of $Al_5Ga_1N_6$ or $Al_3Ga_1N_4$, or the second Ga-rich region in the well layer has a metastable well region composed of a metastable AlGaN in which an AlGaN composition ratio is an integer ratio of $Al_5Ga_7N_{12}$ or $Al_1Ga_2N_3$ or $Al_1Ga_3N_4$, when the first metastable p-type region in the first Ga-rich region is composed of a p-type metastable AlGaN in which an AlGaN composition ratio is an integer ratio of $Al_2Ga_1N_3$.

4. The nitride semiconductor ultraviolet light-emitting element according to claim 3, wherein the active layer has a multi-quantum-well structure including two or more well layers, and a barrier layer composed of an AlGaN-based semiconductor is present between two of the well layers.

5. The nitride semiconductor ultraviolet light-emitting element according to claim 4, wherein the barrier layer is composed of an AlGaN-based semiconductor and has inclined regions inclined with respect to the (0001) plane connecting between adjacent terraces of the multi-step terraces, and terrace regions other than the inclined regions, respectively, and the inclined regions in the barrier layer have a fourth Ga-rich region in which an AlN mole fraction is locally lower than an AlN mole fraction in the terrace regions of the barrier layer.

6. The nitride semiconductor ultraviolet light-emitting element according to claim 2, wherein the active layer has a multi-quantum-well structure including two or more well layers, and a barrier layer composed of an AlGaN-based semiconductor is present between two of the well layers.

7. The nitride semiconductor ultraviolet light-emitting element according to claim 6, wherein the barrier layer is composed of an AlGaN-based semiconductor and has inclined regions inclined with respect to the (0001) plane connecting between adjacent terraces of the multi-step terraces, and terrace regions other than the inclined regions, respectively, and the inclined regions in the barrier layer have a fourth Ga-rich region in which an AlN mole fraction is locally lower than an AlN mole fraction in the terrace regions of the barrier layer.

8. The nitride semiconductor ultraviolet light-emitting element according to claim 1, wherein the p-type layer has a p-type cladding layer composed of a p-type AlGaN-based semiconductor between the electron blocking layer and the contact layer, the p-type cladding layer has inclined regions inclined with respect to the (0001) plane connecting between adjacent terraces of the multi-step terraces, and terrace regions other than the inclined regions, respectively, an AlN mole fraction of the terrace regions in the p-type cladding layer is 52% or more and less than the AlN mole fraction of the terrace regions in the electron blocking layer, and the inclined regions of the p-type cladding layer include a third Ga-rich region in which an AlN mole fraction is locally lower than that of the terrace regions in the p-type cladding layer.

9. The nitride semiconductor ultraviolet light-emitting element according to claim 8, wherein the first Ga-rich region has a first metastable p-type region composed of a p-type metastable AlGaN in which an AlGaN composition ratio is an integer ratio of $Al_5Ga_1N_6$ or $Al_3Ga_1N_4$ or $Al_2Ga_1N_3$, and the third Ga-rich region has a second metastable p-type region composed of a p-type metastable AlGaN in which an AlGaN composition ratio is an integer ratio of $Al_2Ga_1N_3$ or $Al_7Ga_5N_{12}$ or $Al_1Ga_1N_2$ and the AlN mole fraction is less than the AlN mole fraction in the first metastable p-type region.

10. The nitride semiconductor ultraviolet light-emitting element according to claim 9, wherein the second Ga-rich region in the well layer has a metastable well region composed of a metastable AlGaN in which an AlGaN composition ratio is an integer ratio of $Al_1Ga_1N_2$ or $Al_5Ga_7N_{12}$ or $Al_1Ga_2N_3$ or $Al_1Ga_3N_4$, when the first metastable p-type region in the first Ga-rich region is composed of a p-type metastable AlGaN in which an AlGaN composition ratio is an integer ratio of $Al_5Ga_1N_6$ or $Al_3Ga_1N_4$, or the second Ga-rich region in the well layer has a metastable well region composed of a metastable AlGaN in which an AlGaN composition ratio is an integer ratio of $Al_5Ga_7N_{12}$ or $Al_1Ga_2N_3$ or $Al_1Ga_3N_4$, when the first metastable p-type region in the first Ga-rich region is composed of a p-type metastable AlGaN in which an AlGaN composition ratio is an integer ratio of $Al_2Ga_1N_3$.

11. The nitride semiconductor ultraviolet light-emitting element according to claim 10, wherein
the active layer has a multi-quantum-well structure including two or more well layers, and
a barrier layer composed of an AlGaN-based semiconductor is present between two of the well layers.

12. The nitride semiconductor ultraviolet light-emitting element according to claim 11, wherein
the barrier layer is composed of an AlGaN-based semiconductor and has inclined regions inclined with respect to the (0001) plane connecting between adjacent terraces of the multi-step terraces, and terrace regions other than the inclined regions, respectively, and
the inclined regions in the barrier layer have a fourth Ga-rich region in which an AlN mole fraction is locally lower than an AlN mole fraction in the terrace regions of the barrier layer.

13. The nitride semiconductor ultraviolet light-emitting element according to claim 9, wherein
the active layer has a multi-quantum-well structure including two or more well layers, and
a barrier layer composed of an AlGaN-based semiconductor is present between two of the well layers.

14. The nitride semiconductor ultraviolet light-emitting element according to claim 13, wherein
the barrier layer is composed of an AlGaN-based semiconductor and has inclined regions inclined with respect to the (0001) plane connecting between adjacent terraces of the multi-step terraces, and terrace regions other than the inclined regions, respectively, and
the inclined regions in the barrier layer have a fourth Ga-rich region in which an AlN mole fraction is locally lower than an AlN mole fraction in the terrace regions of the barrier layer.

15. The nitride semiconductor ultraviolet light-emitting element according to claim 8, wherein
the active layer has a multi-quantum-well structure including two or more well layers, and
a barrier layer composed of an AlGaN-based semiconductor is present between two of the well layers.

16. The nitride semiconductor ultraviolet light-emitting element according to claim 15, wherein
the barrier layer is composed of an AlGaN-based semiconductor and has inclined regions inclined with respect to the (0001) plane connecting between adjacent terraces of the multi-step terraces, and terrace regions other than the inclined regions, respectively, and
the inclined regions in the barrier layer have a fourth Ga-rich region in which an AlN mole fraction is locally lower than an AlN mole fraction in the terrace regions of the barrier layer.

17. The nitride semiconductor ultraviolet light-emitting element according to claim 8, comprising an underlying part containing a sapphire substrate, wherein
the sapphire substrate has a main surface inclined by a predetermined angle with respect to the (0001) plane,
the light-emitting element structure part is formed above the main surface, and
each semiconductor layer at least from the main surface of the sapphire substrate to the contact layer in the p-type layer is an epitaxially grown layer having a surface on which multi-step terraces parallel to the (0001) plane are formed.

18. The nitride semiconductor ultraviolet light-emitting element according to claim 1, wherein
the active layer has a multi-quantum-well structure including two or more well layers, and
a barrier layer composed of an AlGaN-based semiconductor is present between two of the well layers.

19. The nitride semiconductor ultraviolet light-emitting element according to claim 18, wherein
the barrier layer is composed of an AlGaN-based semiconductor and has inclined regions inclined with respect to the (0001) plane connecting between adjacent terraces of the multi-step terraces, and terrace regions other than the inclined regions, respectively, and
the inclined regions in the barrier layer have a fourth Ga-rich region in which an AlN mole fraction is locally lower than an AlN mole fraction in the terrace regions of the barrier layer.

20. The nitride semiconductor ultraviolet light-emitting element according to claim 1, comprising an underlying part containing a sapphire substrate, wherein
the sapphire substrate has a main surface inclined by a predetermined angle with respect to the (0001) plane,
the light-emitting element structure part is formed above the main surface, and
each semiconductor layer at least from the main surface of the sapphire substrate to the contact layer in the p-type layer is an epitaxially grown layer having a surface on which multi-step terraces parallel to the (0001) plane are formed.

* * * * *